United States Patent
Akao

(10) Patent No.: US 11,094,783 B2
(45) Date of Patent: Aug. 17, 2021

(54) SEMICONDUCTOR DEVICE HAVING A SILICON OXIDE FILM WITH A GRADUAL DOWNWARD INCLINATION AND METHOD OF MANUFACTURING SEMICONDUCTOR DEVICE

(71) Applicant: Mitsubishi Electric Corporation, Tokyo (JP)

(72) Inventor: Shinya Akao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/547,628

(22) Filed: Aug. 22, 2019

(65) Prior Publication Data

US 2020/0144363 A1    May 7, 2020

(30) Foreign Application Priority Data

Nov. 7, 2018    (JP) .............................. JP2018-209636

(51) Int. Cl.
*H01L 29/00* (2006.01)
*H01L 29/06* (2006.01)
*H01L 29/739* (2006.01)
*H01L 29/66* (2006.01)

(52) U.S. Cl.
CPC .... *H01L 29/0696* (2013.01); *H01L 29/66348* (2013.01); *H01L 29/7397* (2013.01)

(58) Field of Classification Search
None
See application file for complete search history.

(56) References Cited

FOREIGN PATENT DOCUMENTS

| JP | H03-076250 A | 4/1991 |
|---|---|---|
| JP | 2010-129707 A | 6/2010 |
| JP | 2011-082411 A | 4/2011 |

*Primary Examiner* — Reema Patel
(74) *Attorney, Agent, or Firm* — Studebaker & Brackett PC

(57) ABSTRACT

A semiconductor device includes: a diffusion layer of a second conductivity type provided on an upper layer portion of a semiconductor layer of a first conductivity type; a polysilicon added structure to be provided on the diffusion layer with a first silicon oxide film therebetween; a second silicon oxide film provided to have contact with an end surface of the polysilicon added structure, and having a gentle downward inclination from the end surface of the polysilicon added structure; and a third silicon oxide film provided on the diffusion layer with a predetermined distance from the end surface of the polysilicon added structure, and covered by the first silicon oxide film, wherein the first silicon oxide film is raised at a portion covering the third silicon oxide film, and constitutes a silicon oxide film with a gentle step-like surface layer formed of the portion raised and the second silicon oxide film.

11 Claims, 20 Drawing Sheets

ADDITIONAL STRUCTURE PART         CELL PART

ADDITIONAL STRUCTURE PART    CELL PART

ADDITIONAL STRUCTURE PART    CELL PART

ADDITIONAL STRUCTURE PART    CELL PART

ADDITIONAL STRUCTURE PART

CELL PART

ADDITIONAL STRUCTURE PART    CELL PART

ADDITIONAL STRUCTURE PART     CELL PART

SEMICONDUCTOR DEVICE HAVING A SILICON OXIDE FILM WITH A GRADUAL DOWNWARD INCLINATION AND METHOD OF MANUFACTURING SEMICONDUCTOR DEVICE

BACKGROUND OF THE INVENTION

Field of the Invention

The present invention relates to a semiconductor device, and particularly to a semiconductor device with an improved manufacturing yield.

Description of the Background Art

It is known that when an abnormal action occurs in a power semiconductor device such as a metal oxide semiconductor field effect transistor (MOSFET) and an insulated gate bipolar transistor (IGBT) due to a temperature rise of the device associated with a switching operation, the power semiconductor device may be damaged. Thus, adopted in many cases is a configuration of adding a diode for detecting a temperature, and preventing an abnormal operation by stopping a switching operation when a temperature rise is detected, as disclosed in Japanese Patent Application Laid-Open No. 2010-129707.

The power semiconductor device receives a mechanical impact power at a time of pressure bonding a wire, for example, to an electrode pad on a surface of the device by wire bonding, thus as disclosed in Japanese Patent Application Laid-Open No. 3-76250, adopted in many cases is a configuration that an impact buffer structure is added below the electrode pad, thereby buffering an impact to a foundation layer. These additional structures are generally formed using polysilicon as a base material.

In providing the additional structure (a polysilicon added structure) using such a polysilicon film as the base material to the power semiconductor device, there may be a process of temporarily forming a conductive film on the polysilicon film and then removing the conductive film. In this case, when the conductive film is not entirely removed but remains on an end portion of the polysilicon film to be a residue, an insulating resistance of the polysilicon added structure and a well diffusion layer which is a lower layer decreases, and a defect occurs, so that a manufacturing yield decreases.

Japanese Patent Application Laid-Open No. 2011-82411 discloses a technique that a series of patterning process (formation of a resist pattern, etching, and removal of a resist) is repeated to process an insulating film to have a step-like shape with no large difference in level so that the residue of the polysilicon film does not occur on a side surface of the insulating film at a time of removing the polysilicon film formed on a thick insulating film. However, the patterning process is repeated, so that the manufacturing process becomes complex.

SUMMARY

Provided is a semiconductor device in which a residue of a conductive film does not occur on an end portion of a polysilicon added structure to improve a manufacturing yield.

A semiconductor device according to the present invention includes: a semiconductor layer of a first conductivity type; a diffusion layer of a second conductivity type provided on an upper layer portion of the semiconductor layer; a polysilicon added structure formed of polysilicon to be provided on the diffusion layer with a first silicon oxide film therebetween; a second silicon oxide film provided to have contact with an end surface of the polysilicon added structure, and having a gentle downward inclination from the end surface of the polysilicon added structure; and a third silicon oxide film provided on the diffusion layer with a predetermined distance from the end surface of the polysilicon added structure, and covered by the first silicon oxide film, wherein the first silicon oxide film is raised at a portion covering the third silicon oxide film, and constitutes a silicon oxide film with a gentle step-like surface layer formed of the portion raised and the second silicon oxide film having the gentle downward inclination.

According to the semiconductor device described above, the second silicon oxide film having the gentle downward inclination from the end surface of the polysilicon added structure is provided, thus even when the step of removing the conductive film is performed after the conductive film is temporally formed, the residue of the conductive film does not occur on the end portion of the polysilicon added structure, thus the semiconductor device with the improved manufacturing yield can be obtained.

These and other objects, features, aspects and advantages of the present invention will become more apparent from the following detailed description of the present invention when taken in conjunction with the accompanying drawings.

DESCRIPTION OF THE PREFERRED EMBODIMENTS

<Introduction>

Figure 1:
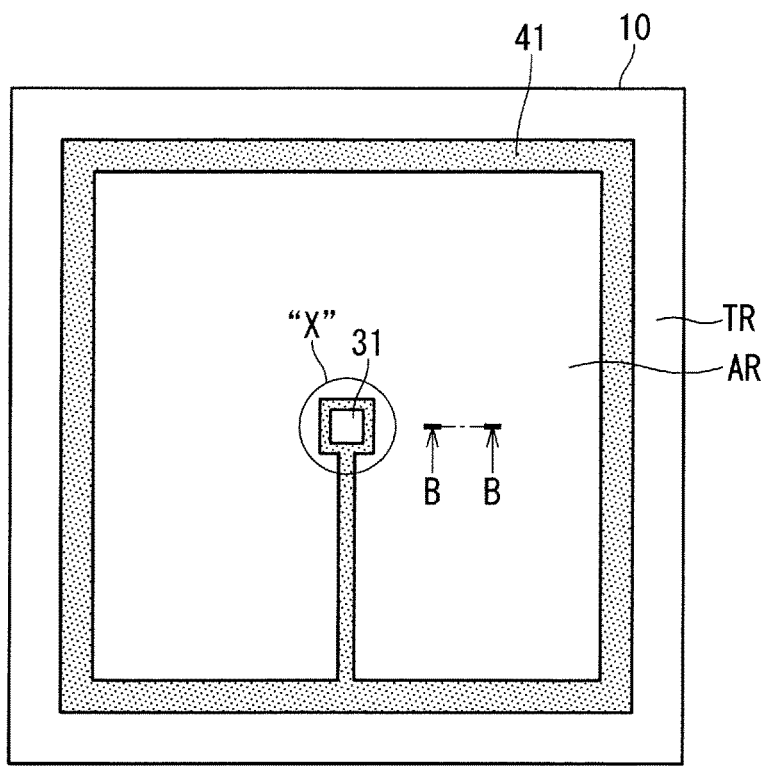
FIG. 1 is a plan view schematically showing an upper surface configuration of a whole trench gate type IGBT in an embodiment 1 according to the present invention.

Embodiments according to the present invention are described with reference to the appended drawings. Since the drawings are schematically illustrated, a mutual relationship of sizes and positions of images respectively illustrated in the different drawings is not necessarily illustrated accurately, but may be appropriately changed. In the description hereinafter, the same reference numerals will be assigned to a similar constituent element and a name and function are also similar. Thus, the detailed description of them may be omitted in some cases.

In the following description, even when terms indicating a specific position and direction such as "upper", "lower", "side", "bottom", "front" and "rear" are stated, the terms are used to facilitate understanding of embodiments for convenience, and therefore, irrelevant to directions in practical implementation. An "outer side" indicates a direction toward an outer periphery of the semiconductor device, and an "inner side" indicates a direction opposite to the "outer side" hereinafter.

In the description hereinafter, an n type is generally defined as a "first conductive type" and a p type is generally defined as a "second conductive type" regarding a conductivity type of an impurity, however, an opposite definition is also applicable.

Embodiment 1

<Configuration of Device>

FIG. 1 is a plan view schematically showing an upper surface configuration of a whole trench gate type IGBT 100 in an embodiment 1 according to the present invention. The trench gate type IGBT 100 shown in FIG. 1 has a square shape as an outer shape, and a large part thereof is provided with an active region AR in which a plurality of minimum unit structures of an IGBT (IGBT cell) called a "unit cell" are disposed, and an outer side of the active region AR is surrounded by a terminal region TR. A plurality of gate trenches (not shown) are parallelly provided with an interval therebetween in the active region AR. The plurality of gate trenches are connected to a gate wiring provided in the active region AR and the gate wiring is connected to a gate pad, however, they are remotely related to the embodiments, thus the illustration and the description are omitted.

FIG. 1 only shows a polysilicon added structure 31 provided on a semiconductor layer 10 and a well diffusion layer 41 provided below the polysilicon added structure 31 as a configuration related to the present embodiment, thus the illustration of the other elements such as a gate electrode, an emitter electrode, and an electrode pad is omitted for convenience.

As shown in FIG. 1, in the trench gate type IGBT 100, the polysilicon added structure 31 is provided in a center part of the active region AR, and the well diffusion layer 41 is provided below the polysilicon added structure 31 and in the terminal region TR. The well diffusion layer 41 is provided to surround the active region AR in the terminal region TR, and the well diffusion layer 41 located below the polysilicon added structure 31 is provided to extend from a center to an end of the active region AR so that it is connected to the well diffusion layer 41 in the terminal region TR. The polysilicon added structure 31 shown in FIG. 1 is a diode for detecting a temperature, and is made up of an anode region including a p type impurity and a pn junction diode having a cathode region including an n type impurity.

Figure 2:
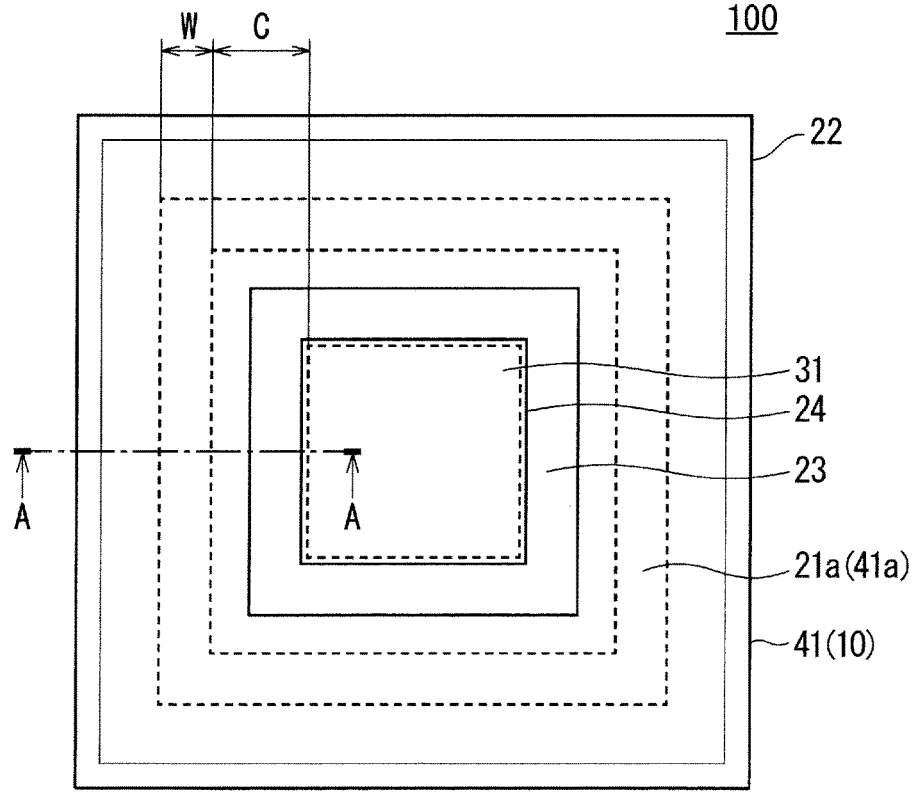
FIG. 2 is a plan view showing a configuration of a polysilicon added structure of the trench gate type IGBT in the embodiment 1 according to the present invention.

FIG. 2 shows an enlarged plan view of a region "X" shown in FIG. 1. A characteristic configuration shown in the region "X" is described as the embodiments according to the present invention hereinafter, and FIG. 1 is common in each embodiment.

FIG. 2 is a plan view showing a configuration of the polysilicon added structure 31 of the trench gate type IGBT 100 in the embodiment 1 according to the present invention. As shown in FIG. 2, the polysilicon added structure 31 has a square shape as an outer shape, includes a silicon oxide film 23 (a second silicon oxide film) around the polysilicon added structure 31, and includes a looped silicon oxide film 21a (a third silicon oxide film) with a width W (a first width) surrounding the polysilicon added structure 31 in a position on an outer side of an end surface of the polysilicon added structure 31, being separated from the outer side thereof by a distance C (a predetermined distance). The looped silicon oxide film 21a is also referred to as the looped film in some cases hereinafter.

A well diffusion layer 41a (a low concentration diffusion layer) having a lower impurity concentration than that of the surrounding well diffusion layer 41 is formed immediately below the looped silicon oxide film 21a. The silicon oxide film 23 and the silicon oxide film 21a constitute a characteristic part of the present embodiment.

Figure 3:
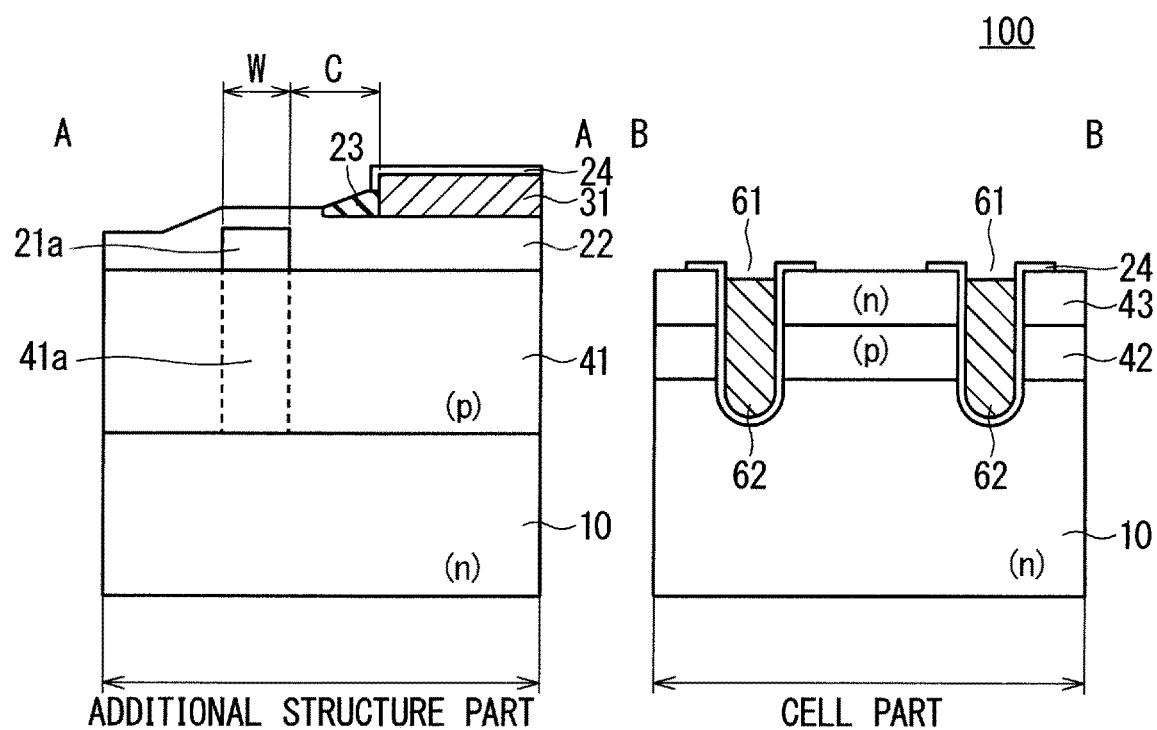
FIG. 3 is a partial cross-sectional view of the trench gate type IGBT in the embodiment 1 according to the present invention.

FIG. 3 shows a cross-sectional view along an A-A line in FIG. 2 as a cross section of an additional structure part and a cross-sectional view along a B-B line in FIG. 1 as a cross section of a cell part arranged side by side. It is for an easy illustration of a relationship of the manufacturing process between the additional structure part and the cell part.

As shown in FIG. 3, the polysilicon added structure 31 is formed on the well diffusion layer 41 of p type (the second conductivity type), which is provided on an upper layer portion on one main surface side of the semiconductor layer 10 of n type (the first conductivity type), with a silicon oxide film 22 (a first silicon oxide film) therebetween. The semiconductor layer 10 may be a silicon (Si) layer, a silicon carbide (SiC) layer, a gallium nitride (GaN) layer, or the other wideband gap semiconductor layer.

The silicon oxide film 23 is provided to have contact with the end surface of the polysilicon added structure 31, and the silicon oxide film 23 is provided to have a gentle downward inclination from the end surface of the polysilicon added structure 31. The silicon oxide film 23 is provided on the end surface of the polysilicon added structure 31, thus the residue of the conductive film does not occur on the end surface of the polysilicon added structure 31.

The silicon oxide film 21a with the width W is provided in the position on the outer side of the end surface of the polysilicon added structure 31, being separated from the outer side thereof by the distance C, and the silicon oxide film 21a is covered by the silicon oxide film 22. The silicon oxide film 22 has a downward inclination in which a thickness of the silicon oxide film 22 decreases with a decreasing distance toward an outer side of the silicon oxide film 21a.

A silicon oxide film 24 (an insulating film) is provided to cover an upper surface and the end surface of the polysilicon added structure 31, and the silicon oxide film 24 functions as a gate insulating film in a cell part.

That is to say, in the cell part, a p-type diffusion layer 42 is provided on the upper layer portion on the one main surface side of the semiconductor layer 10, and an n type diffusion layer 43 is provided on the diffusion layer 42. A gate trench 61 is provided to pass through the diffusion layers 43 and 42 and reach an inner portion of the semiconductor layer 10.

The silicon oxide film 24 is provided to cover an inner surface of the gate trench 61 and an upper side of the diffusion layer 43 near the gate trench 61, and functions as a gate insulating film. A polysilicon gate electrode 62 containing an impurity is embedded in the gate trench 61 covered by the silicon oxide film 24.

As the other configurations, a gate wiring is provided on the gate electrode 62, an interlayer insulating film is provided to cover the gate wiring, and an emitter electrode passing through the interlayer insulating film to reach the diffusion layer 43 between the gate trenches 61 is provided, however, these configurations are remotely related to the present embodiment, thus the illustration thereof is omitted.

A p type diffusion layer is provided on the other main surface side of the semiconductor layer 10 and a collector electrode is provided to have contact with the diffusion layer and constitutes the IGBT, however, these configurations are remotely related to the present embodiment, thus the illustration thereof is omitted.

The semiconductor layer 10 described above may be a semiconductor substrate such as an Si substrate, an SiC substrate, and a GaN substrate, and also may be a substrate made up of only an epitaxial layer formed through processes of forming the epitaxial layer on a semiconductor substrate such as an Si substrate, an SiC substrate, and a GaN substrate and then removing the semiconductor substrate by a mechanical method, a chemical method, or the other method.

<Manufacturing Method>

Next, the reason that the residue of the conductive film does not occur on the end surface of the polysilicon added structure 31 is described using FIG. 4 to FIG. 29 showing a manufacturing process. In the description hereinafter, FIGS. 4, 6, 8, 10, 12, 14, 16, 18, 20, 22, 24, 26, 28, and 30 are plan views corresponding to FIG. 2, and FIGS. 5, 7, 9, 11, 13, 15, 17, 19, 21, 23, 25, 27, 29, and 31 are cross-sectional views corresponding to FIG. 3.

Figure 4:
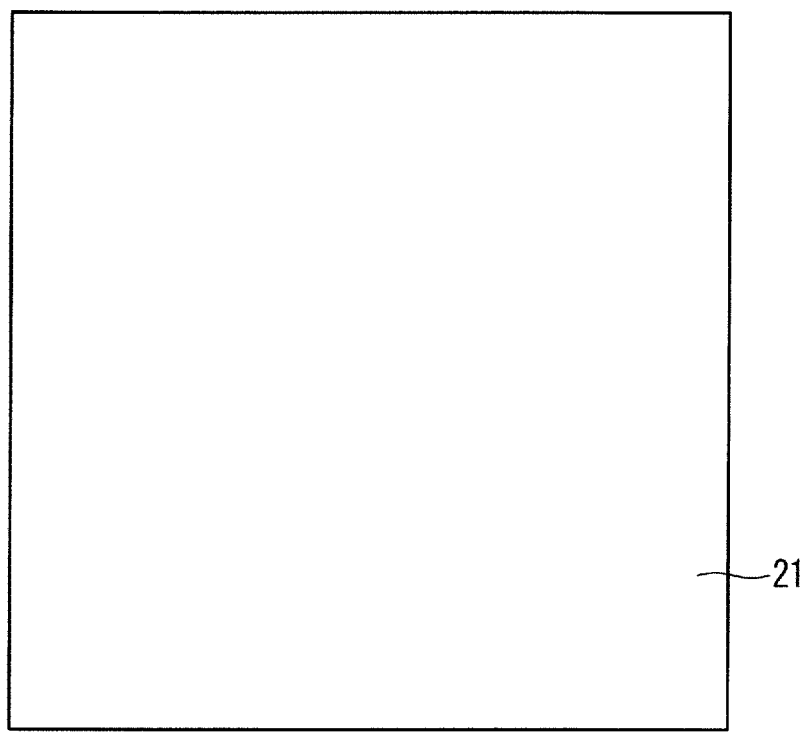
FIG. 4 is a plan view for describing a manufacturing process of the polysilicon added structure of the trench gate type IGBT in the embodiment 1 according to the present invention.
Figure 5:
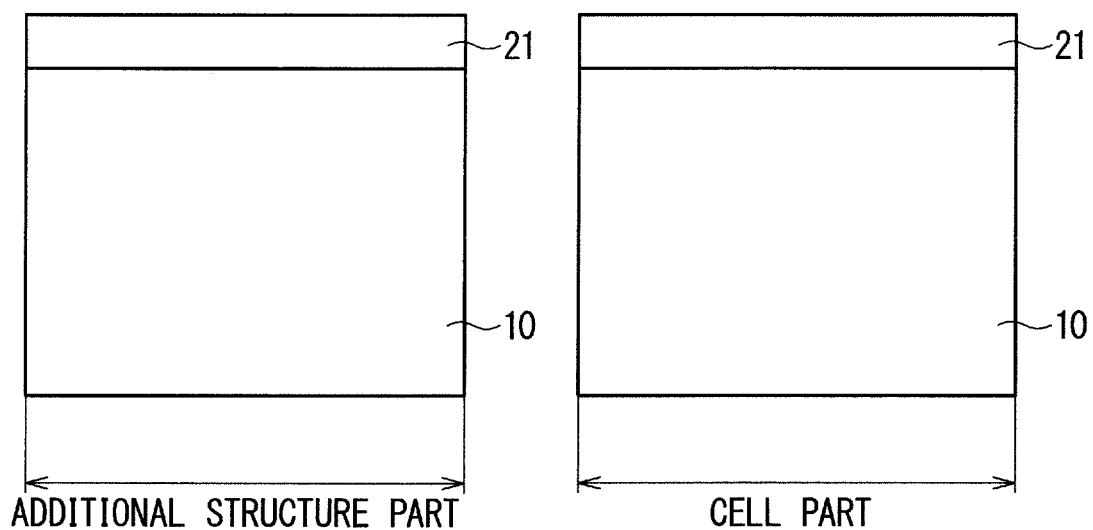
FIG. 5 is a partial cross-sectional view for describing a manufacturing process of the trench gate type IGBT in the embodiment 1 according to the present invention.

Firstly, as shown in FIG. 4 and FIG. 5, the silicon oxide film 21 is formed on the one main surface of the n type semiconductor layer 10. A thermal oxidation method or a chemical vapor deposition (CVD) method may be applied as a method of forming thereof.

Figure 6:
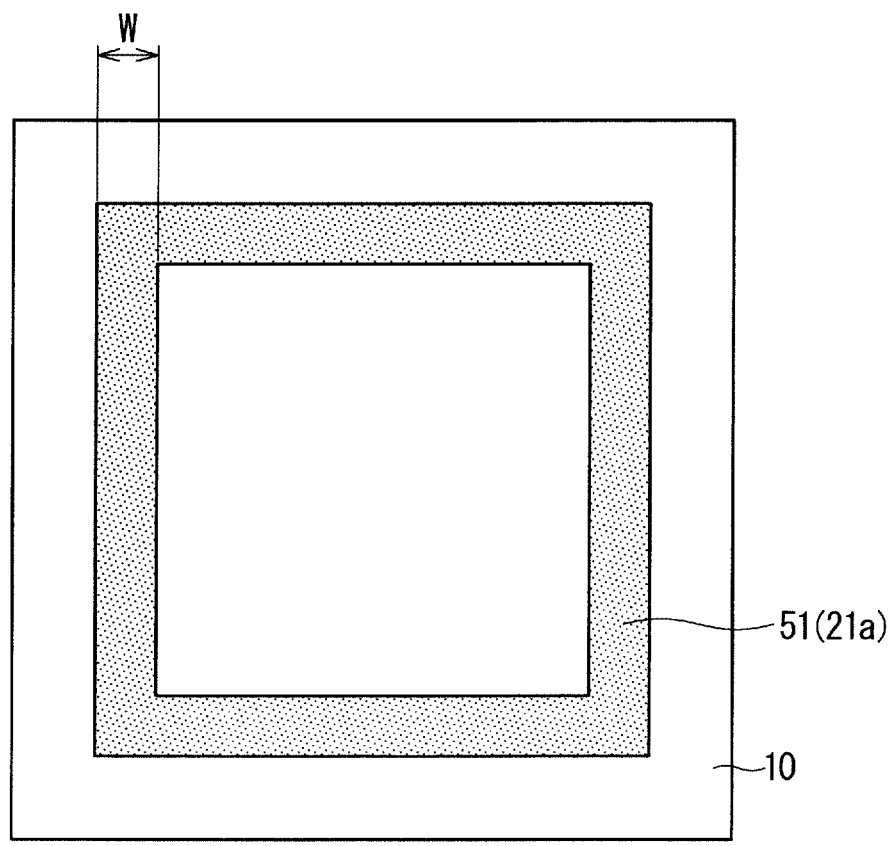
FIG. 6 is a plan view for describing a manufacturing process of the polysilicon added structure of the trench gate type IGBT in the embodiment 1 according to the present invention.
Figure 7:
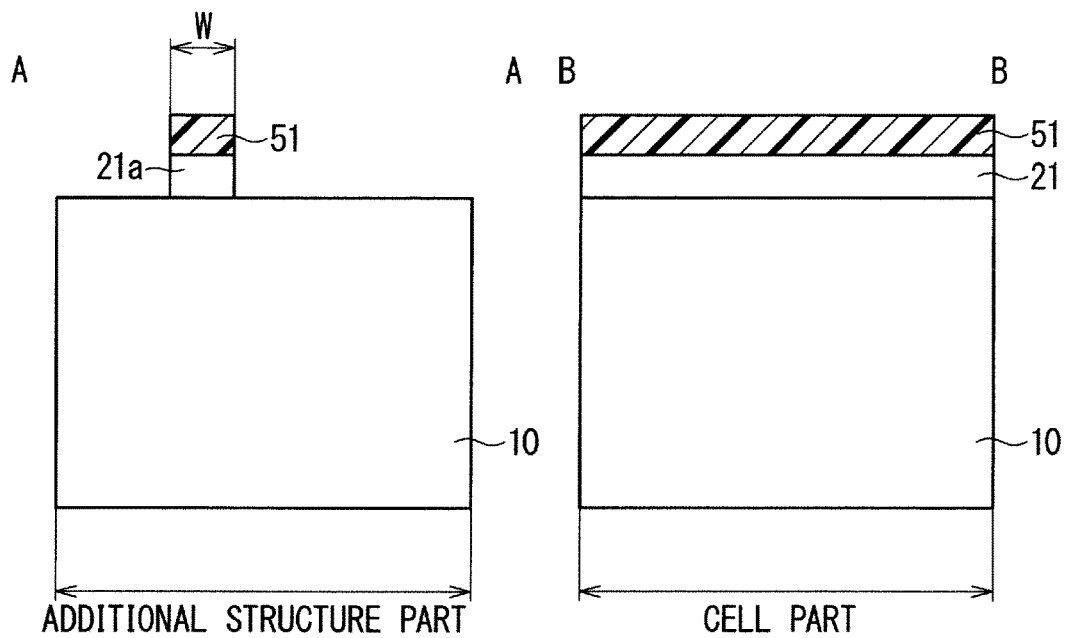
FIG. 7 is a partial cross-sectional view for describing the manufacturing process of the trench gate type IGBT in the embodiment 1 according to the present invention.

Next, in a process shown in FIG. 6 and FIG. 7, a resist member is applied on the silicon oxide film 21, and a photomechanical process is performed so that the resist member remains only in a region where the silicon oxide film 21a is formed in the additional structure part, thereby forming a resist mask 51. The resist mask 51 has a looped shape with the width W similar to that of the silicon oxide film 21a in a plan view. In the cell part, the resist member covers the whole cell part to remain as the resist mask 51.

Then, a dry etching is performed on the silicon oxide film 21 using the resist mask 51 as an etching mask, and the silicon oxide film 21 is patterned to have the looped shape, thus the looped silicon oxide film 21a (the looped film) with the width W is formed in the additional structure part. The silicon oxide film 21 is not patterned but remains in the cell part.

Figure 8:
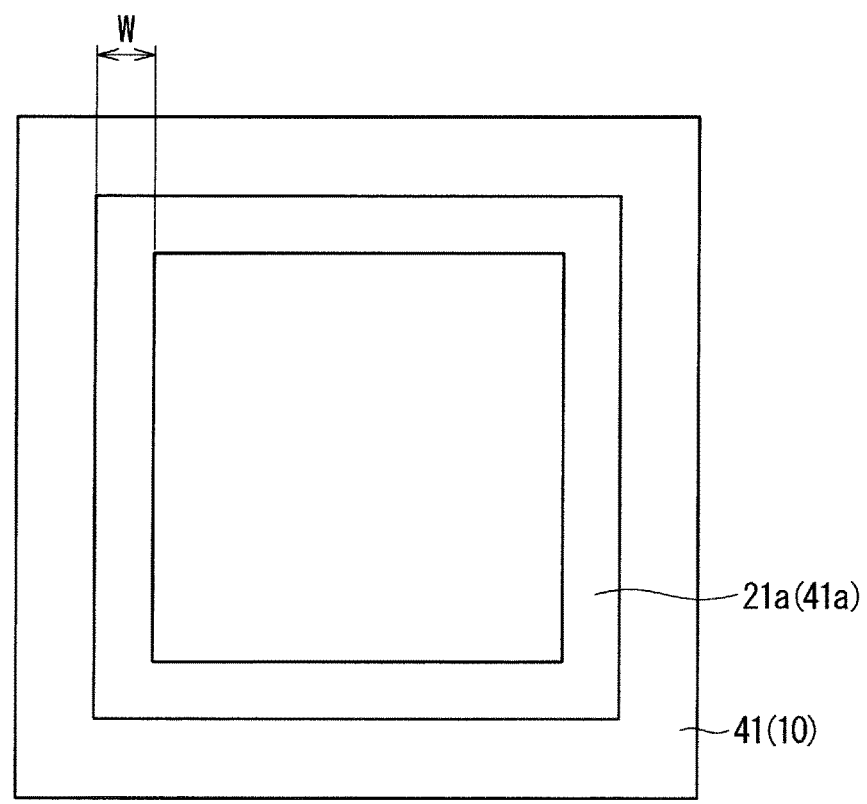
FIG. 8 is a plan view for describing a manufacturing process of the polysilicon added structure of the trench gate type IGBT in the embodiment 1 according to the present invention.
Figure 9:
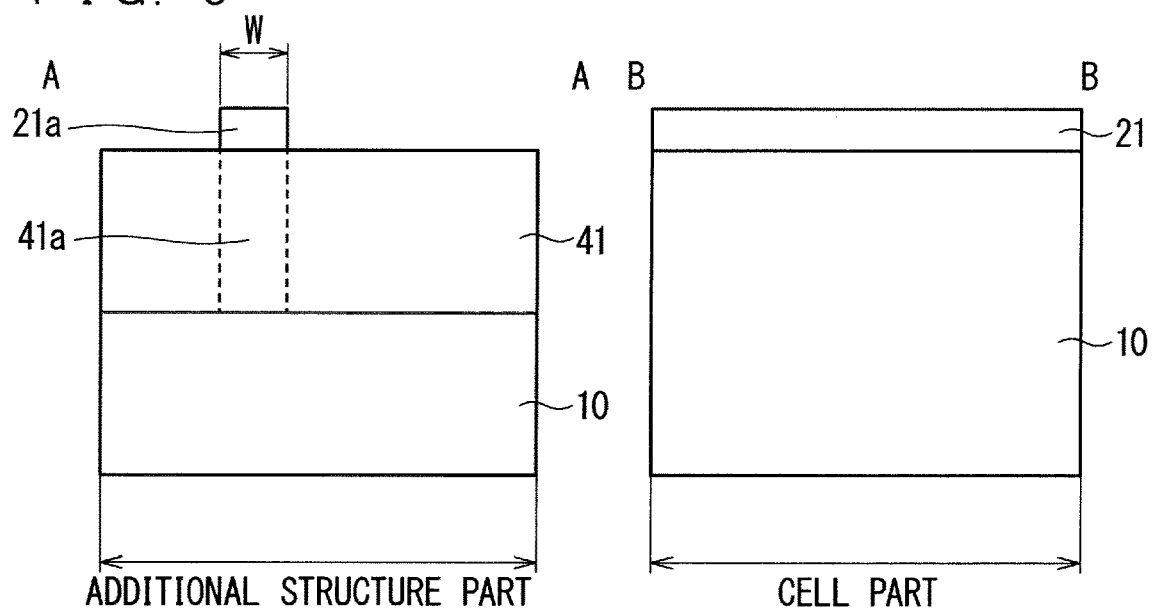
FIG. 9 is a partial cross-sectional view for describing a manufacturing process of the trench gate type IGBT in the embodiment 1 according to the present invention.

After the resist mask 51 is removed, p type impurity ions are implanted from an upper side of the semiconductor layer 10 in a process shown in FIG. 8 and FIG. 9, thus the well diffusion layer 41 is formed on the upper layer portion of the semiconductor layer 10. At this time, the ions are not implanted immediately below the silicon oxide film 21a but the well diffusion layer 41a is formed only by a lateral direction diffusion of the implanted ions (dopant), thus an impurity concentration of the well diffusion layer 41a is lower than that of the surrounding well diffusion layer 41.

If the width W of the silicon oxide film 21a described using FIG. 8 and FIG. 9 is too large, a region where the well diffusion layer 41 is not formed occurs immediately below the silicon oxide film 21a only by the lateral direction diffusion of the dopant. Accordingly, the width W of the silicon oxide film 21a is set to have a value smaller than 2.0 times as large as a distance of the lateral direction diffusion of the dopant or a value smaller than 1.2 times as large as a distance of a vertical direction diffusion of the dopant.

According to such a setting, the well diffusion layer 41 becomes the well diffusion layer 41a having a decreased concentration immediately below the silicon oxide film 21a, however, the region where the well diffusion layer 41 is not formed does not occur immediately below the silicon oxide film 21a.

Figure 10:
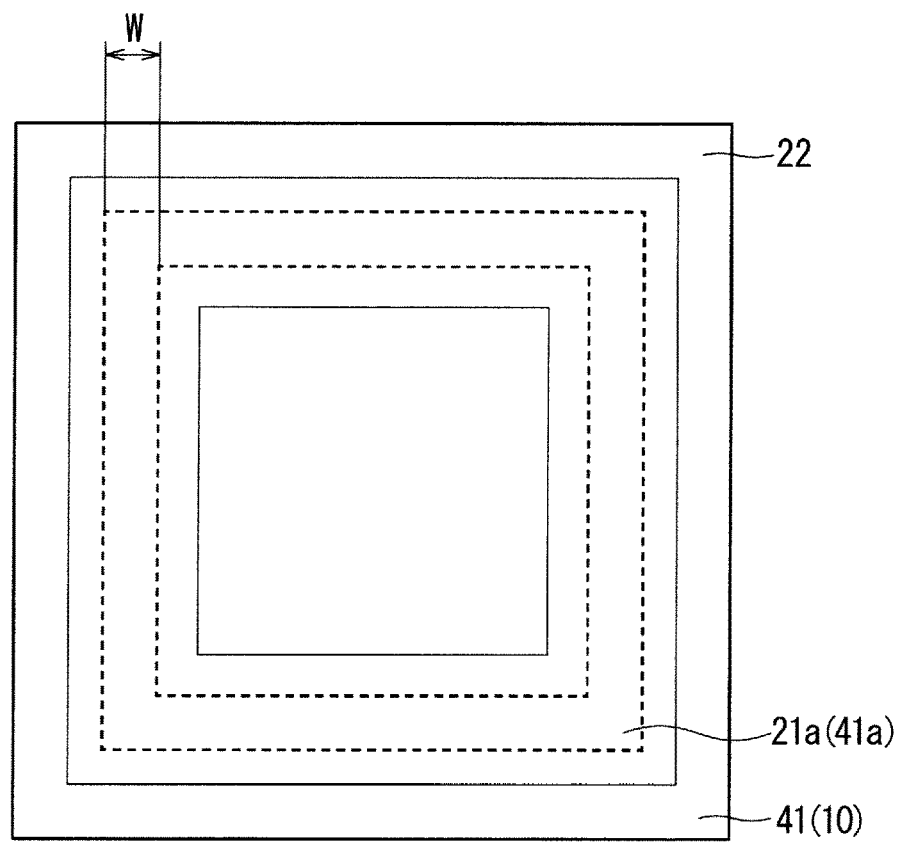
FIG. 10 is a plan view for describing a manufacturing process of the polysilicon added structure of the trench gate type IGBT in the embodiment 1 according to the present invention.
Figure 11:
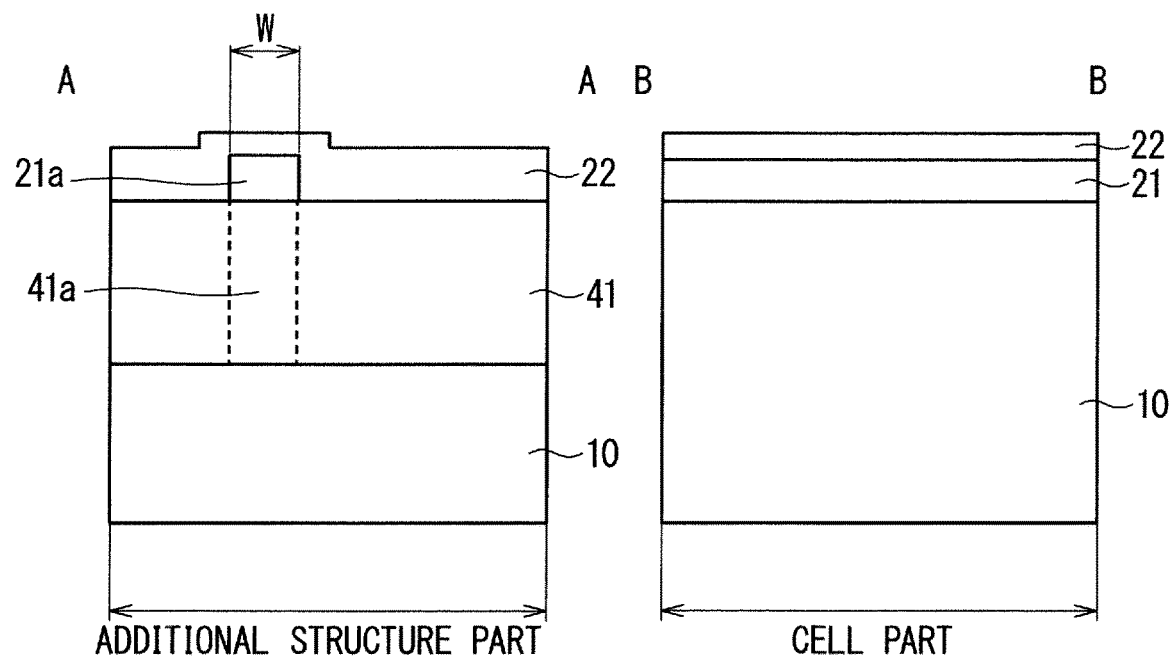
FIG. 11 is a partial cross-sectional view for describing a manufacturing process of the trench gate type IGBT in the embodiment 1 according to the present invention.

Next, in the process shown in FIG. 10 and FIG. 11, the silicon oxide film 22 serving as a foundation layer of the polysilicon added structure 31 is formed. The silicon oxide film 22 covers an upper side of the well diffusion layer 41 and an upper side of the silicon oxide film 21a in the additional structure part and covers the silicon oxide film 21 in the cell part. In the additional structure part, a portion covering the upper side of the silicon oxide film 21a has a height higher than a surrounding portion thereof, thus the additional structure part has a raised surface layer.

Figure 12:
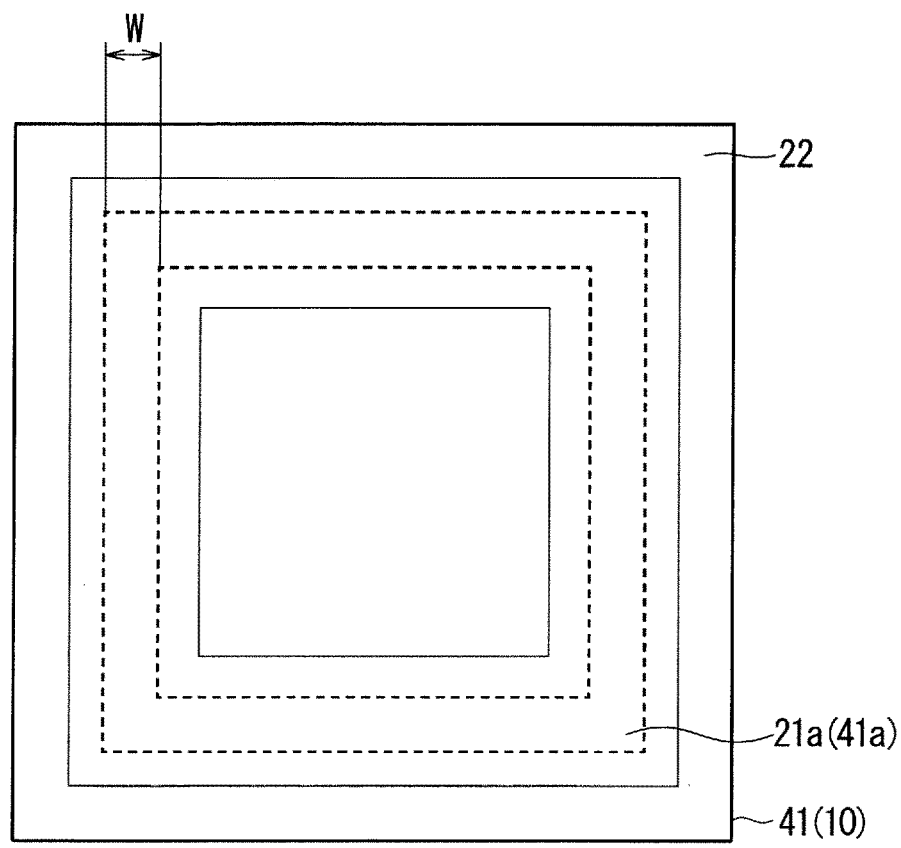
FIG. 12 is a plan view for describing a manufacturing process of the polysilicon added structure of the trench gate type IGBT in the embodiment 1 according to the present invention.
Figure 13:
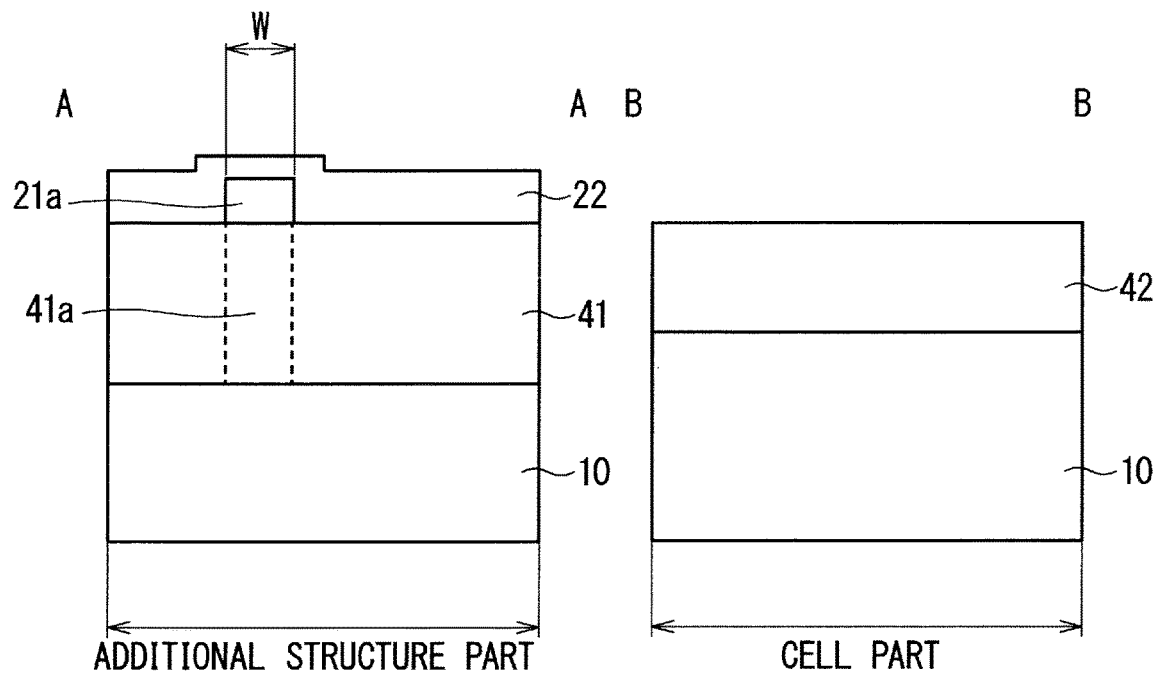
FIG. 13 is a partial cross-sectional view for describing a manufacturing process of the trench gate type IGBT in the embodiment 1 according to the present invention.

Next, in a process shown in FIG. 12 and FIG. 13, after the silicon oxide films 22 and 21 in the cell part are removed, a p type impurity is ion-implanted in the upper layer portion of the semiconductor layer 10 in the cell part to form the diffusion layer 42. The silicon oxide film 22 is left in the additional structure part, thus the p type impurity is not implanted therein.

Figure 14:
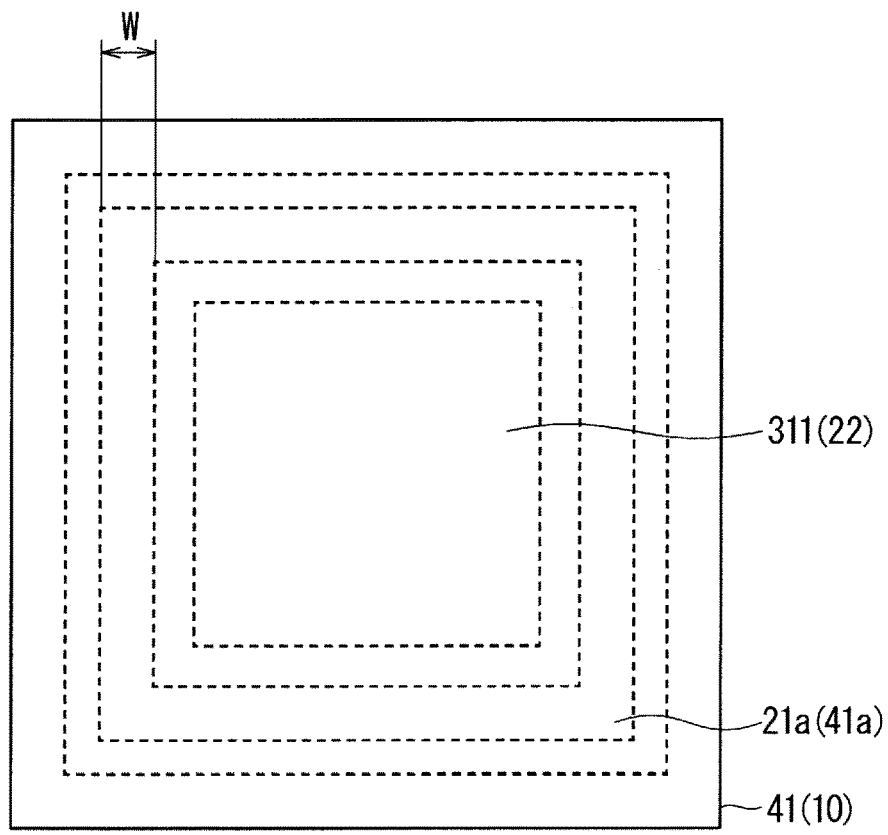
FIG. 14 is a plan view for describing a manufacturing process of the polysilicon added structure of the trench gate type IGBT in the embodiment 1 according to the present invention.
Figure 15:
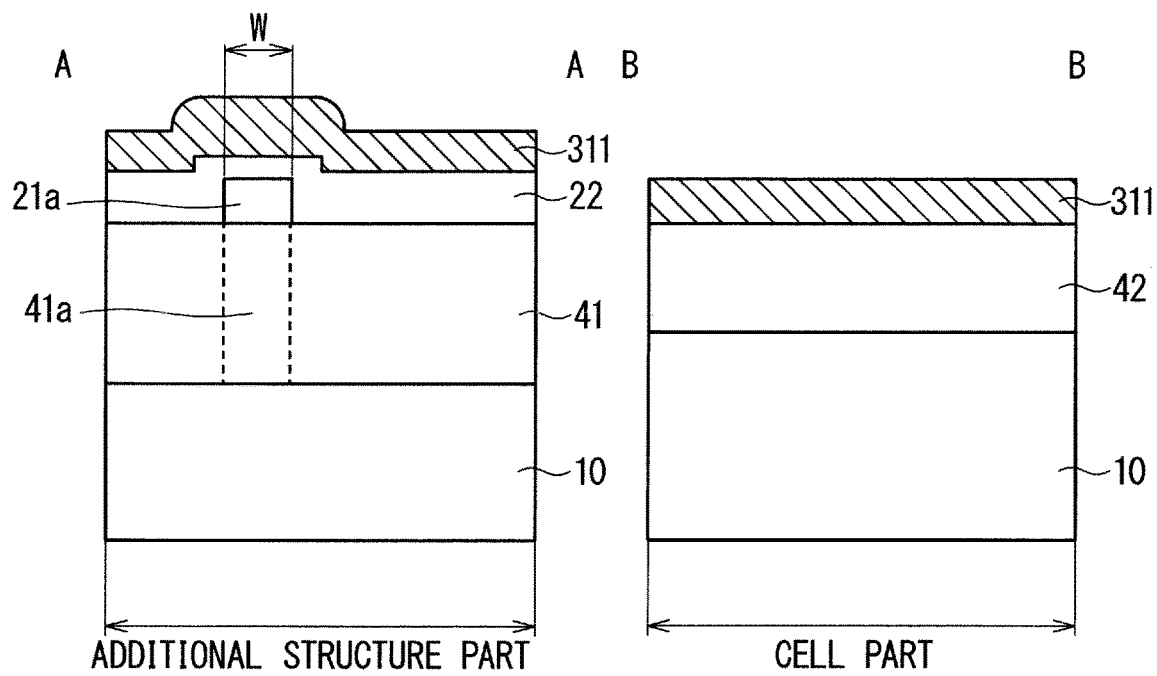
FIG. 15 is a partial cross-sectional view for describing a manufacturing process of the trench gate type IGBT in the embodiment 1 according to the present invention.

Next, in the process shown in FIG. 14 and FIG. 15, a polysilicon film 311 serving as a foundation member of the polysilicon added structure 31 is formed by the CVD method, for example. When the polysilicon added structure 31 is the diode for detecting the temperature, at least one of a p type impurity and an n type impurity is introduced by the ion implantation to form an anode region containing the p type impurity and a cathode region containing the n type impurity in the polysilicon film 311, and a pn junction is formed. An ion implantation region is set so that the pn junction is formed in the region where the polysilicon added structure 31 is formed.

Figure 16:
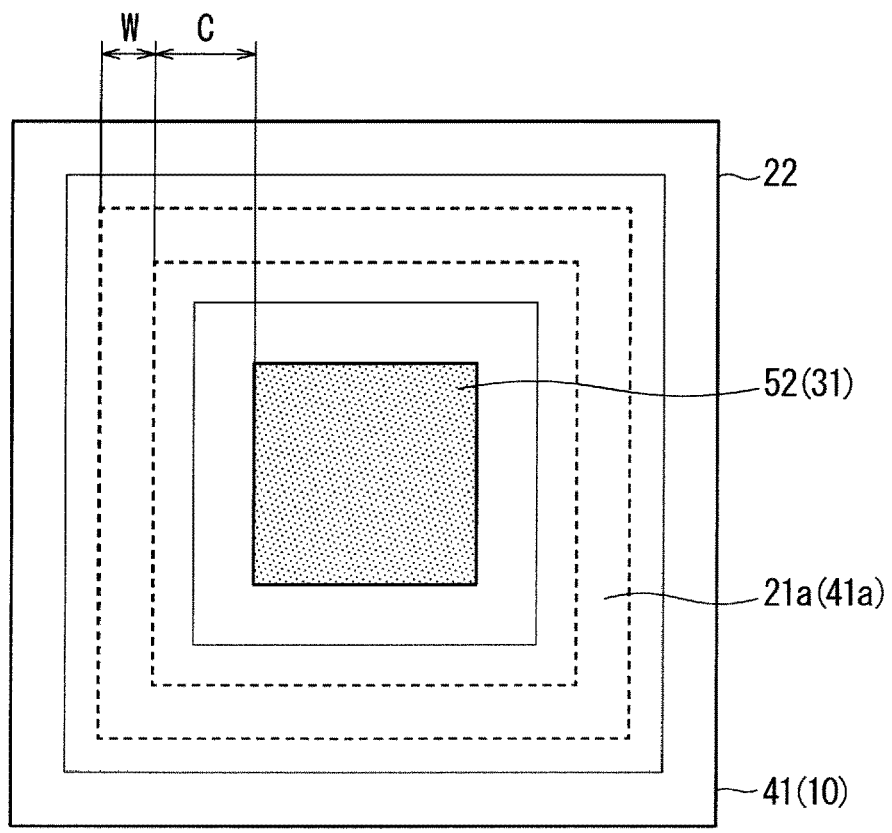
FIG. 16 is a plan view for describing a manufacturing process of the polysilicon added structure of the trench gate type IGBT in the embodiment 1 according to the present invention.
Figure 17:
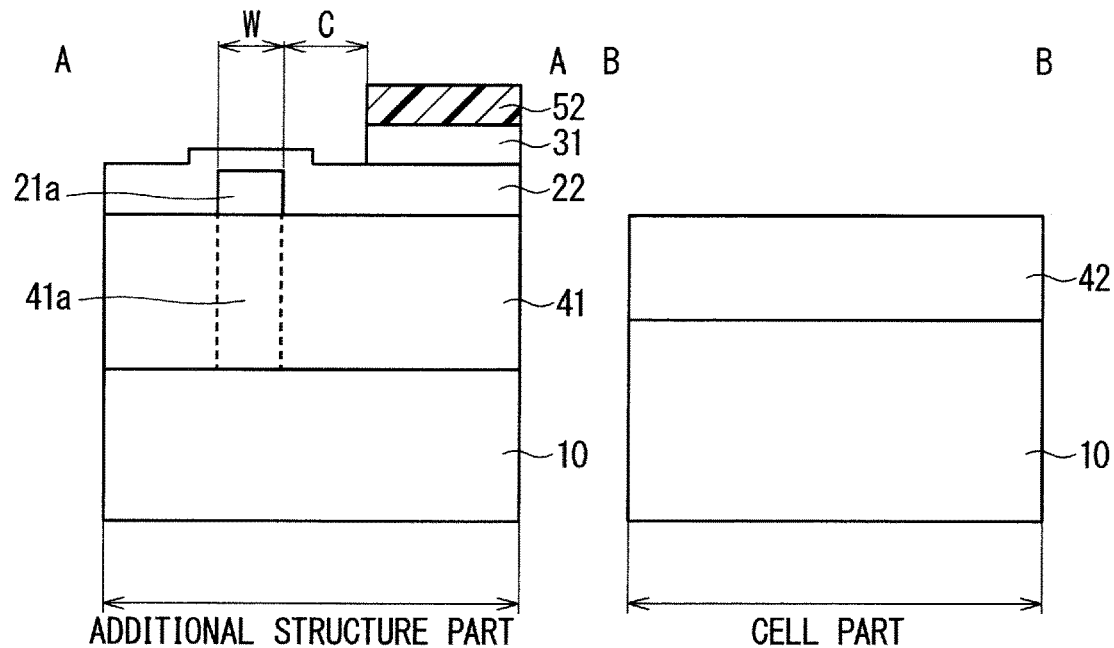
FIG. 17 is a partial cross-sectional view for describing a manufacturing process of the trench gate type IGBT in the embodiment 1 according to the present invention.

Next, in a process shown in FIG. 16 and FIG. 17, a resist member is applied on the polysilicon film 311, and a photomechanical process is performed so that the resist member remains only in the region where the polysilicon added structure 31 is formed in the additional structure part, thereby forming a resist mask 52. The resist mask 52 has a square shape similar to that of the polysilicon added structure 31 in a plan view.

Then, a dry etching is performed on the polysilicon film 311 using the resist mask 52 as an etching mask, and the polysilicon film 311 is patterned to have the square shape, thus the polysilicon added structure 31 is formed in the additional structure part. The resist member is removed in the cell part, thus the polysilicon film 311 is removed.

On the polysilicon added structure 31, the resist mask 52 is formed so that the end surface of the polysilicon added structure 31 is located in a position separated from an end surface on an inner side of the looped silicon oxide film 21a by the distance C.

Figure 18:
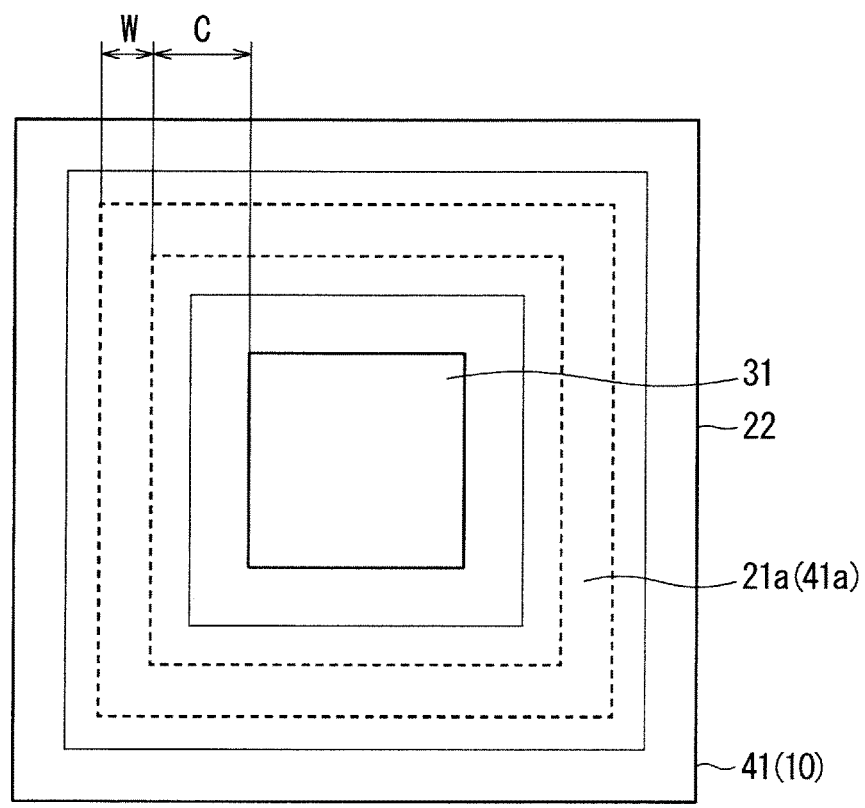
FIG. 18 is a plan view for describing a manufacturing process of the polysilicon added structure of the trench gate type IGBT in the embodiment 1 according to the present invention.
Figure 19:
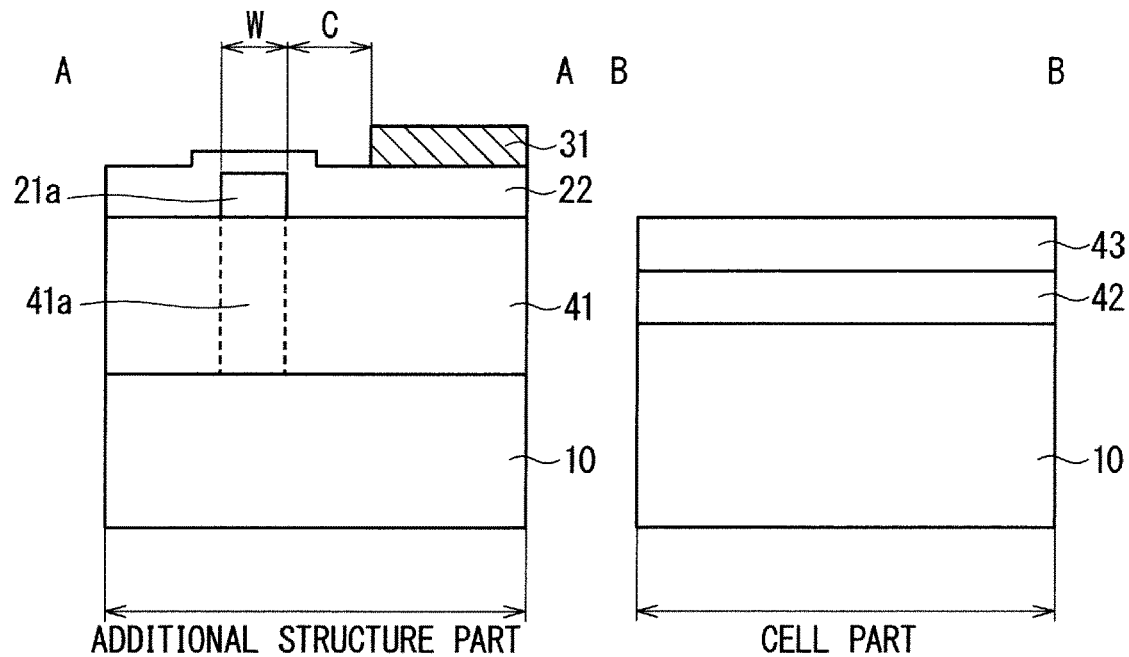
FIG. 19 is a partial cross-sectional view for describing a manufacturing process of the trench gate type IGBT in the embodiment 1 according to the present invention.

After the resist mask 52 is removed, in a process shown in FIG. 18 and FIG. 19, an n type impurity is ion-implanted in an upper layer portion of the diffusion layer 42 in the cell part to form the diffusion layer 43. When the polysilicon added structure 31 is the diode for detecting the temperature, the n type impurity may be implanted in a resist opening region at this stage to form the pn junction.

Figure 20:
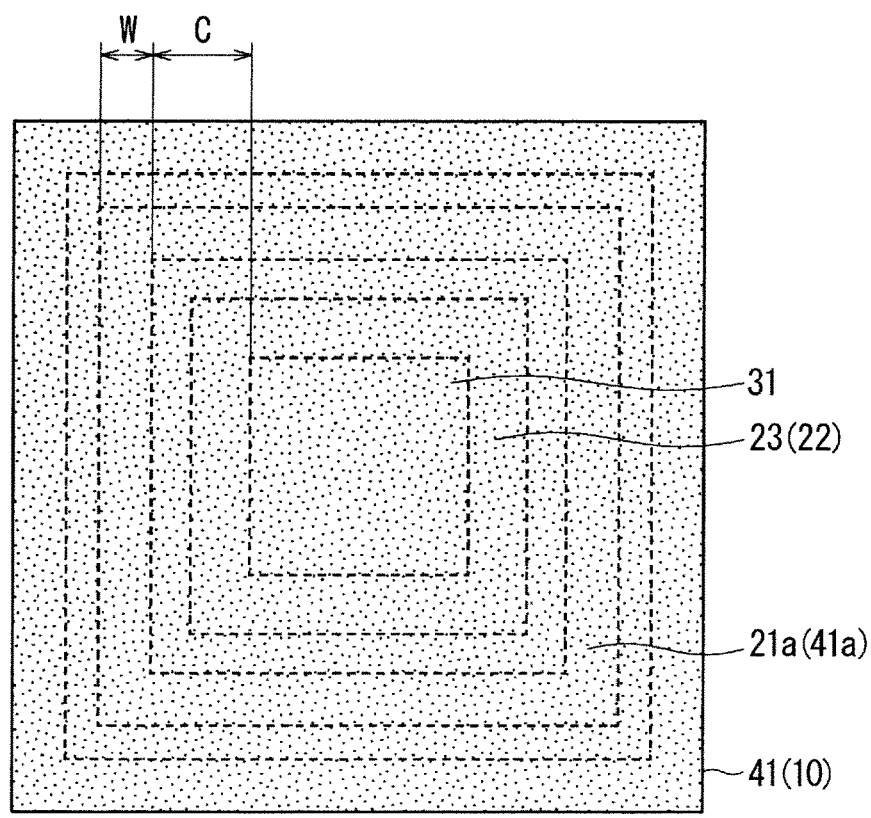
FIG. 20 is a plan view for describing a manufacturing process of the polysilicon added structure of the trench gate type IGBT in the embodiment 1 according to the present invention.
Figure 21:
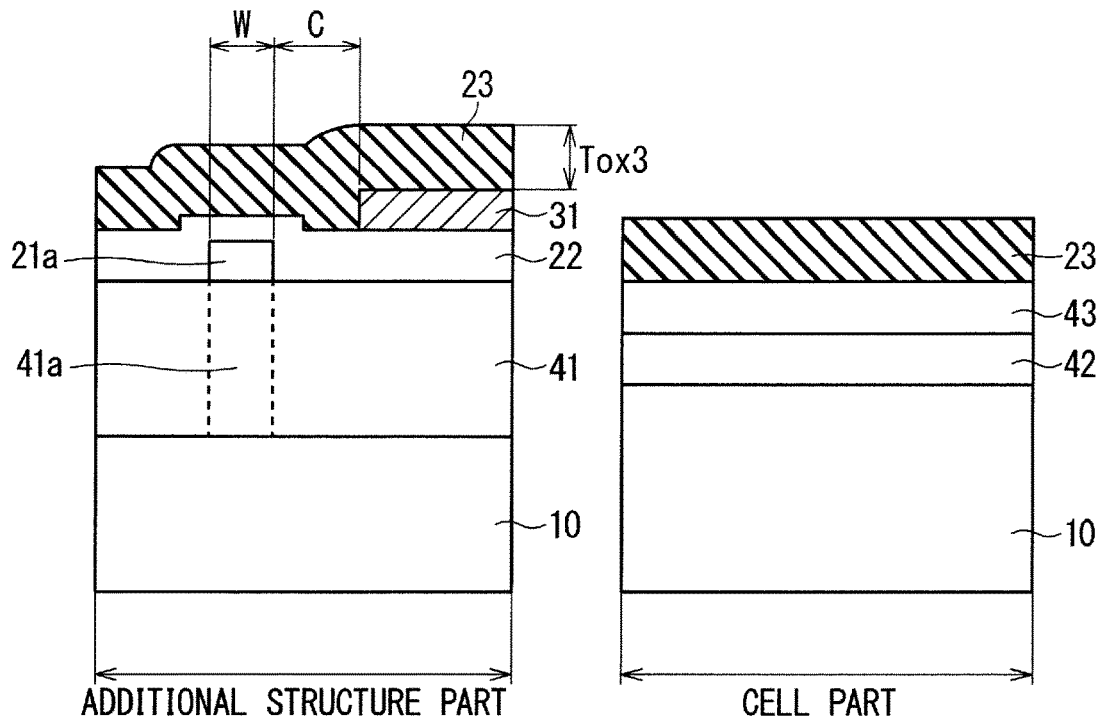
FIG. 21 is a partial cross-sectional view for describing a manufacturing process of the trench gate type IGBT in the embodiment 1 according to the present invention.

Next, in the process shown in FIG. 20 and FIG. 21, the silicon oxide film 23 serving as the etching mask at the time of forming the trench gate in the cell part is formed. The silicon oxide film 23 is also formed in the additional structure part, and the silicon oxide film 23 has a gentle step-like surface layer due to the raised portion caused by the silicon oxide film 21a in an end edge part of the polysilicon added structure 31.

Herein, the distance C from the end surface of the polysilicon added structure 31 to the looped silicon oxide film 21a is set to have a value smaller than twice as large as a film thickness Tox3 of the silicon oxide film 23 so that the silicon oxide film 23 has the gentle step-like surface layer in the end edge part of the polysilicon added structure 31.

Figure 22:
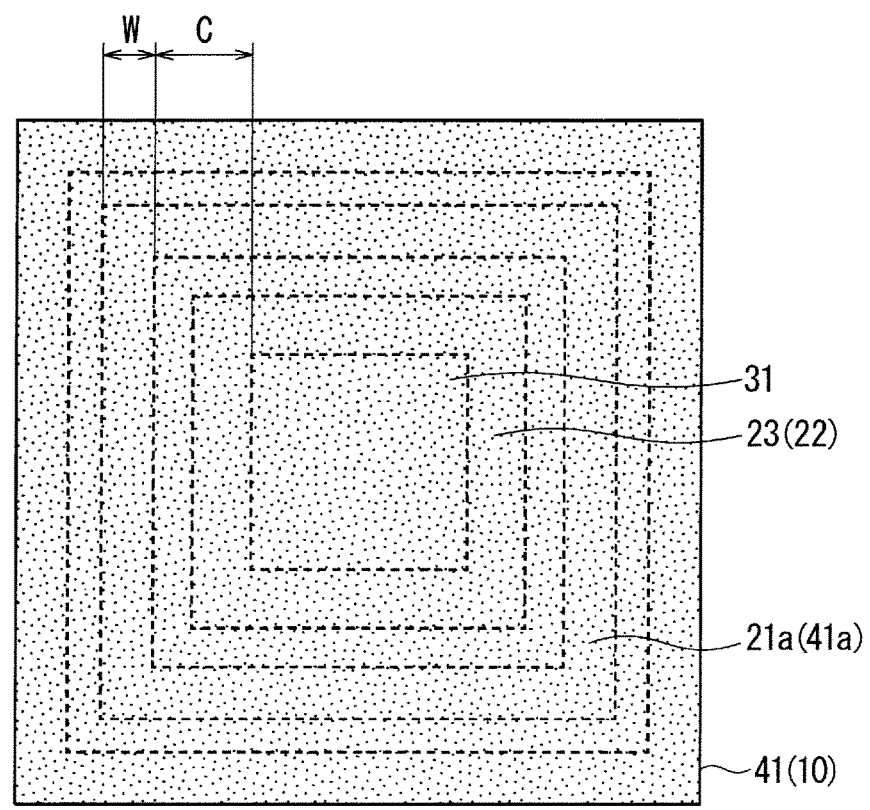
FIG. 22 is a plan view for describing a manufacturing process of the polysilicon added structure of the trench gate type IGBT in the embodiment 1 according to the present invention.
Figure 23:
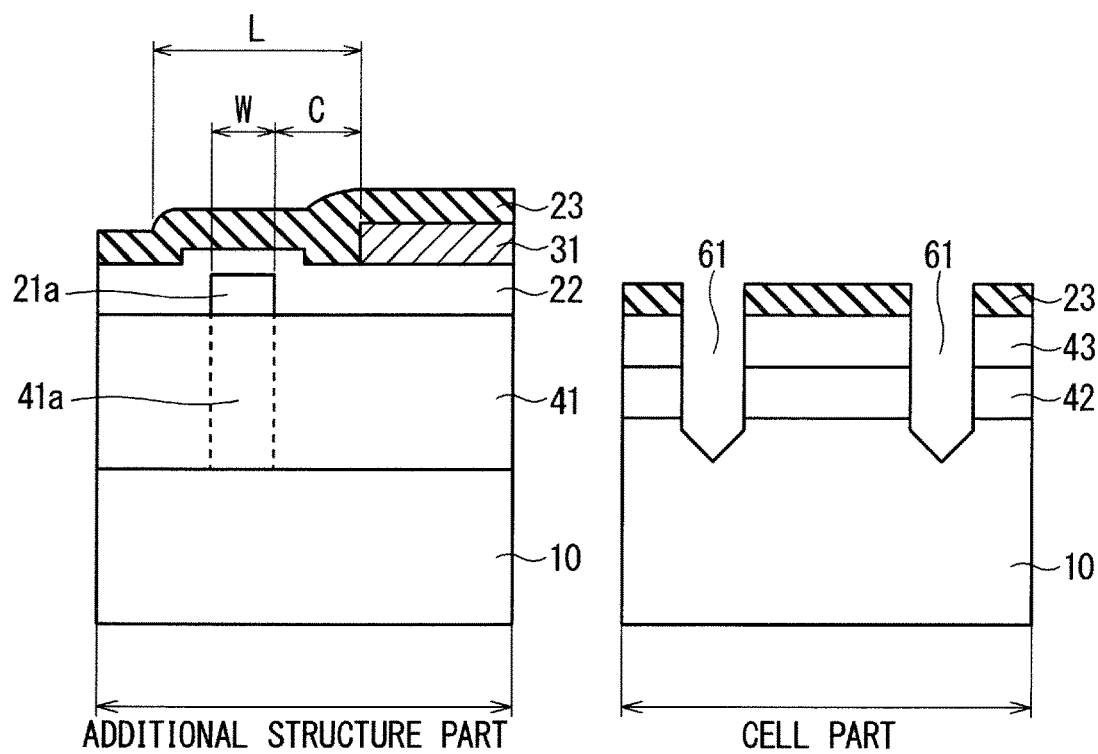
FIG. 23 is a partial cross-sectional view for describing a manufacturing process of the trench gate type IGBT in the embodiment 1 according to the present invention.

Next, in a process shown in FIG. 22 and FIG. 23, the silicon oxide film 23 is patterned and provided with an opening in a portion corresponding to the region where the gate trench 61 is formed, thereby forming an etching mask, and a dry etching is performed using the etching mask to form the gate trench 61 which passes through the diffusion layers 43 and 42 in the cell part and reaches the inner portion of the semiconductor layer 10. According to this processing, the film thickness of the silicon oxide film 23 decreases to some degree.

Subsequently, oxidization and an isotropic etching such as a wet etching and a chemical dry etching (CDE) are repeated several times to remove an etching damage layer in an inner wall surface layer of the gate trench 16 in the cell part. Accordingly to this processing, an inner wall of the gate trench 16 is smoothed and the silicon oxide film 23 in the cell part is completely removed in the process shown in FIG. 24 and FIG. 25. However, in the additional structure part, the film thickness of the silicon oxide film 23 in a perpendicular direction is large in a portion between the raised portion in the surface layer of the silicon oxide film 22 caused by the silicon oxide film 21a and the polysilicon added structure 31, so that the silicon oxide film 23 is not completely removed, but the silicon oxide film 23 remains to have the gentle downward inclination from the end surface of the polysilicon added structure 31. In other words, the portion ranging from the end surface of the polysilicon added structure 31 to the silicon oxide film 21a is covered by the silicon oxide film having the gentle step-like surface layer.

Figure 26:
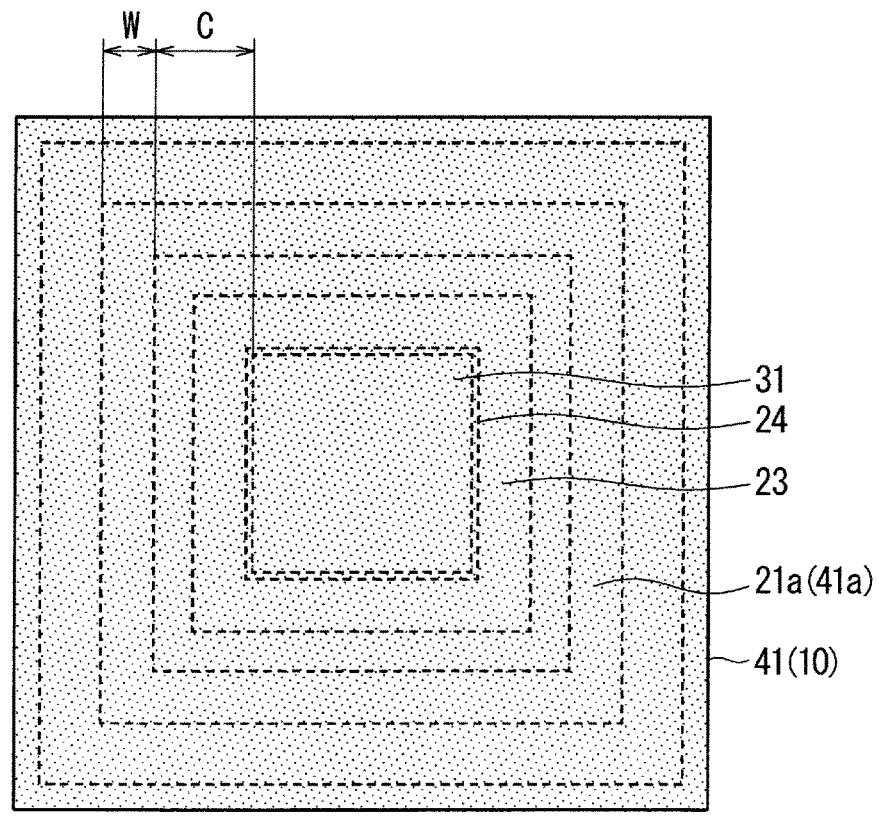
FIG. 26 is a plan view for describing a manufacturing process of the polysilicon added structure of the trench gate type IGBT in the embodiment 1 according to the present invention.
Figure 27:
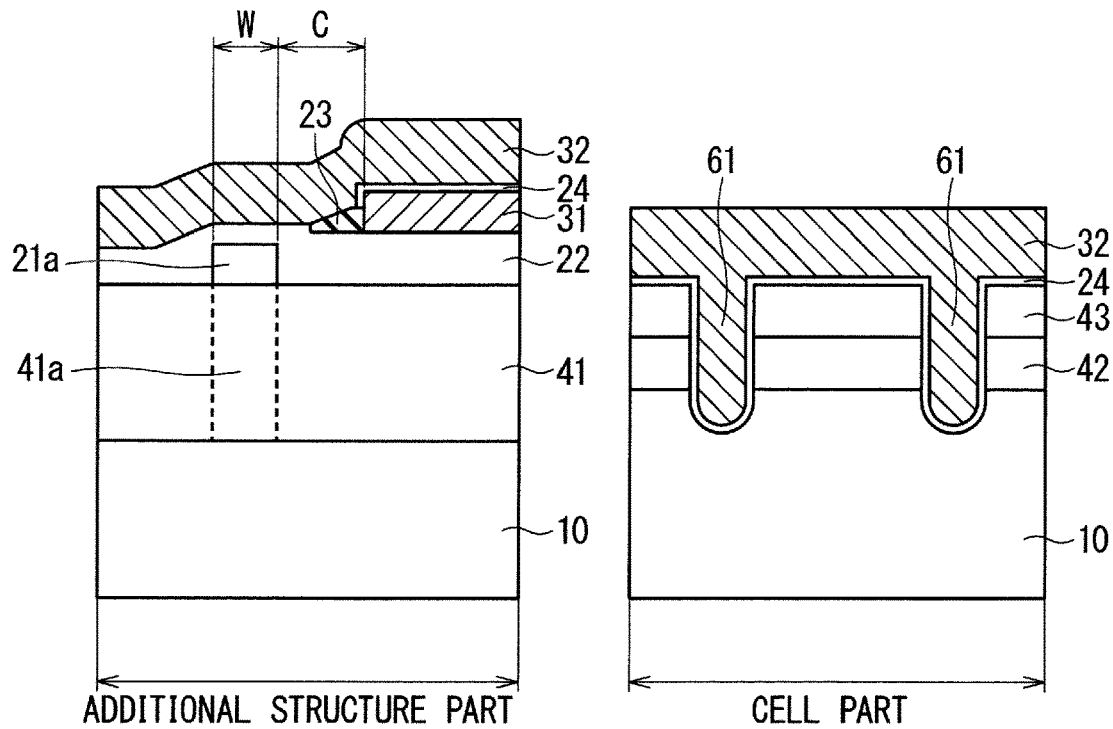
FIG. 27 is a partial cross-sectional view for describing a manufacturing process of the trench gate type IGBT in the embodiment 1 according to the present invention.

Next, in a processing shown in FIG. 26 and FIG. 27, the entire surface of the silicon oxide film 24 is formed to cover the inner surface of the gate trench 61 in the cell part and the polysilicon added structure 31 in the additional structure part. The silicon oxide film 24 is not illustrated on the silicon oxide film 23 and the silicon oxide film 22 in the additional structure part by reason that they are the same silicon oxide films and cannot be distinguished from each other, thus the illustration is omitted.

After the silicon oxide film 24 is formed, the entire surface of the polysilicon film 32 is formed by the CVD method, for example, and the gate trench 61 is embedded with the polysilicon film 32 in the cell part. Herein, in the additional structure part, the silicon oxide film 23 remains on the end surface of the polysilicon added structure 31, thus the polysilicon film 32 has the gentle step-like surface layer near the end portion of the polysilicon added structure 31, and the film thickness of the polysilicon film 32 in a perpendicular direction is small.

Next, the polysilicon film 32 is etched to remain only in an inner side of the gate trench 61, and the gate electrode 62 is formed. At this time, in the additional structure part, the film thickness of the polysilicon film 32 in the perpendicular direction is small near the end portion of the polysilicon added structure 31, thus as shown in FIG. 2 and FIG. 3, the residue of the polysilicon film 32 does not occur on the end surface of the polysilicon added structure 31.

As described above, in the trench gate type IGBT 100 according to the present embodiment 1, the looped silicon oxide film 21a is provided to surround the polysilicon added structure 31, thus the portion near the end portion of the polysilicon added structure 31 from the end surface of the polysilicon added structure 31 to the silicon oxide film 21a is covered by the silicon oxide film having the gentle step-like surface layer, and the well diffusion layer 41a formed immediately below the silicon oxide film 21a has a lower impurity concentration than that in the portion surrounding the well diffusion layer 41a. By applying such a configuration, the residue of the conductive film does not occur on the end surface of the polysilicon added structure 31, and even when a high voltage is applied between the polysilicon added structure 31 and the well diffusion layer 41, an electrical insulation is maintained and thus a defect does not occur, thus a manufacturing yield can be increased. Only the process of providing the silicon oxide film 21a is added to obtain the effect described above, thus the manufacturing process does not become complex.

<Modification Example>

In the trench gate type IGBT 100 according to the embodiment 1 described above, as described using FIG. 8 and FIG. 9, the width W of the silicon oxide film 21a is set to have the value smaller than 2.0 times as large as the distance of the lateral direction diffusion of the dopant or the value smaller than 1.2 times as large as the distance of the vertical direction diffusion of the dopant.

Figure 28:
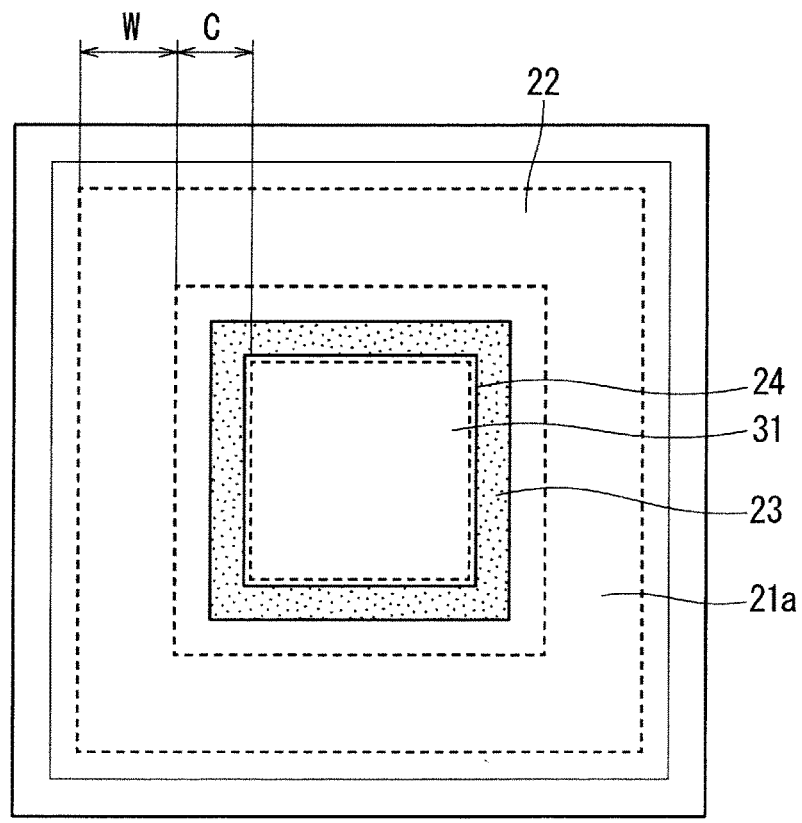
FIG. 28 is a plan view showing a configuration of a polysilicon added structure of the trench gate type IGBT in a modification example of the embodiment 1 according to the present invention.
Figure 29:
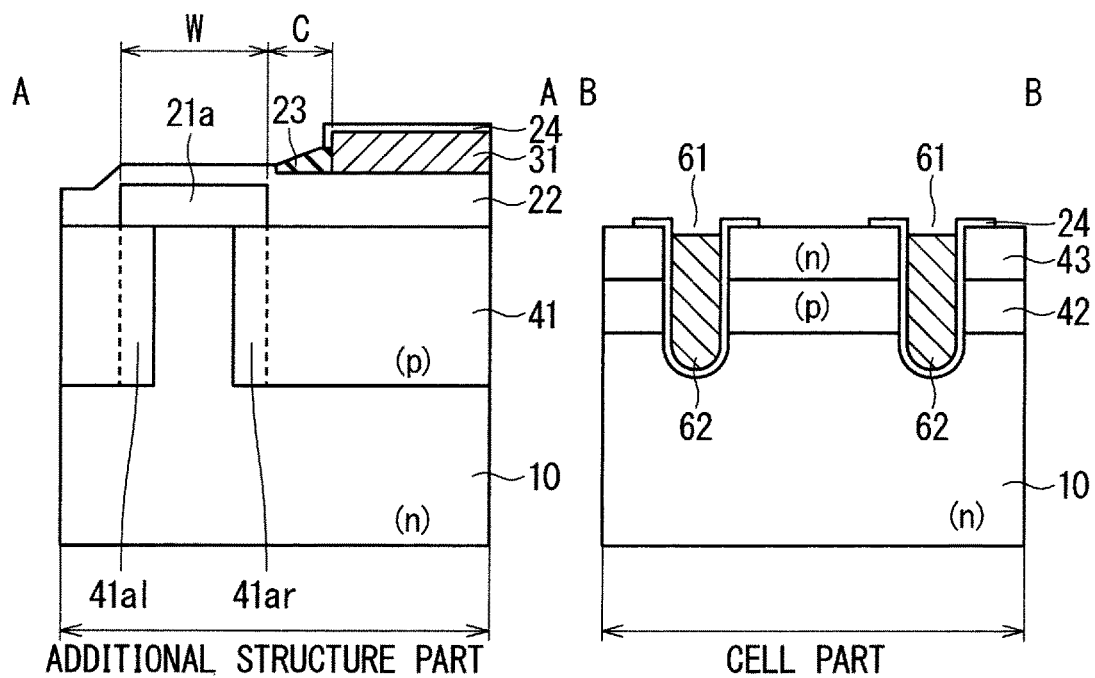
FIG. 29 is a partial cross-sectional view of the trench gate type IGBT in the modification example of the embodiment 1 according to the present invention.

However, in the present modification example, as shown in FIG. 28 and FIG. 29, the width W of the silicon oxide film 21a is set to have the value equal to or larger than 2.0 times as large as the distance of the lateral direction diffusion of the dopant or the value equal to or larger than 1.2 times as large as the distance of the vertical direction diffusion of the dopant.

As a result, a well diffusion layer 41al (a second low concentration diffusion layer) having a decreased concentration is formed immediately below an outer end edge part of the silicon oxide film 21a, a well diffusion layer 41ar (a first low concentration diffusion layer) having a decreased concentration is formed immediately below an inner end edge part of the silicon oxide film 21a, and the well diffusion layer 41 is not formed between the well diffusion layers 41al and 41ar but the n type region is formed.

Since the well diffusion layer 41 and the semiconductor layer 10 need only be electrically insulated from the polysilicon added structure 31 with the silicon oxide film 22 therebetween, there is no problem even when there is a region where the well diffusion layer 41 is not partially formed as in the case described above.

Figure 24:
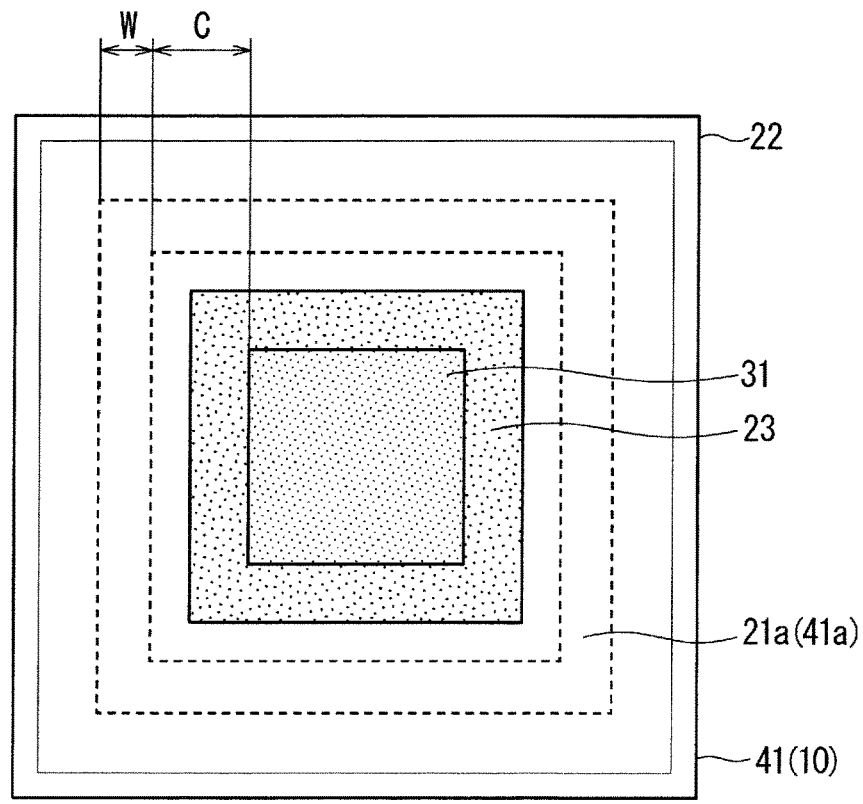
FIG. 24 is a plan view for describing a manufacturing process of the polysilicon added structure of the trench gate type IGBT in the embodiment 1 according to the present invention.
Figure 25:
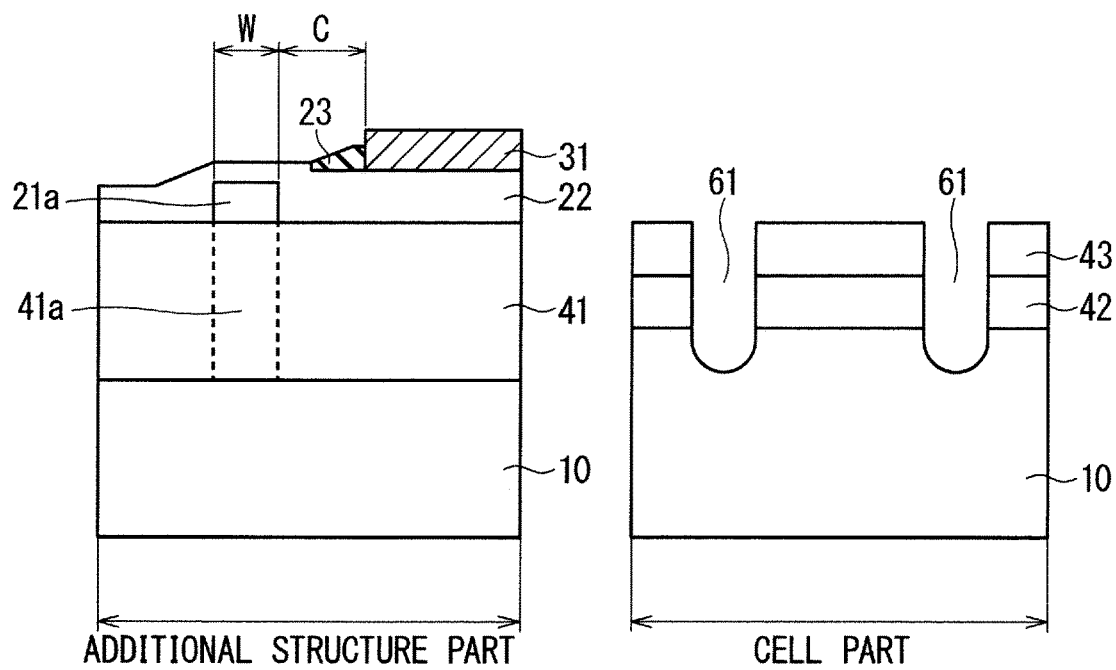
FIG. 25 is a partial cross-sectional view for describing a manufacturing process of the trench gate type IGBT in the embodiment 1 according to the present invention.

In the meanwhile, when the width W of the silicon oxide film 21a is increased, it can be prevented that the silicon oxide film 23 is removed from the end surface of the polysilicon added structure 31 in the process of performing the oxidization and the isotropic etching several times on the gate trench 16 in the cell part described using FIG. 24 and FIG. 25.

That is to say, when the width W of the silicon oxide film 21a is increased, a sum of the distance C from the end surface of the polysilicon added structure 31 to the looped silicon oxide film 21a and the width W increases, and a length of the silicon oxide film 23 (L shown in FIG. 23) extending outward beyond the silicon oxide film 21a from the end surface of the polysilicon additional structure 31 increases by the sum. As a result, even when the etching such as the wet etching or the CDE with a large side etching is applied, it can be prevented that the silicon oxide film 23 is removed from the end surface of the polysilicon added structure 31.

Figure 30:
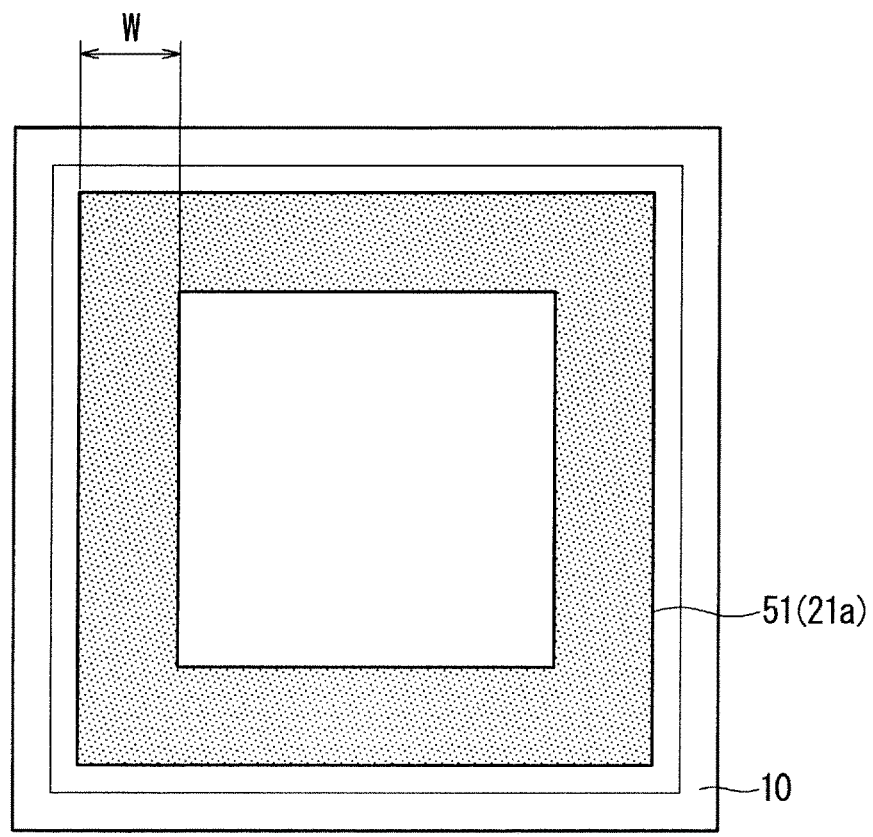
FIG. 30 is a plan view for describing a manufacturing process of the polysilicon added structure of the trench gate type IGBT in the modification example of the embodiment 1 according to the present invention.
Figure 31:
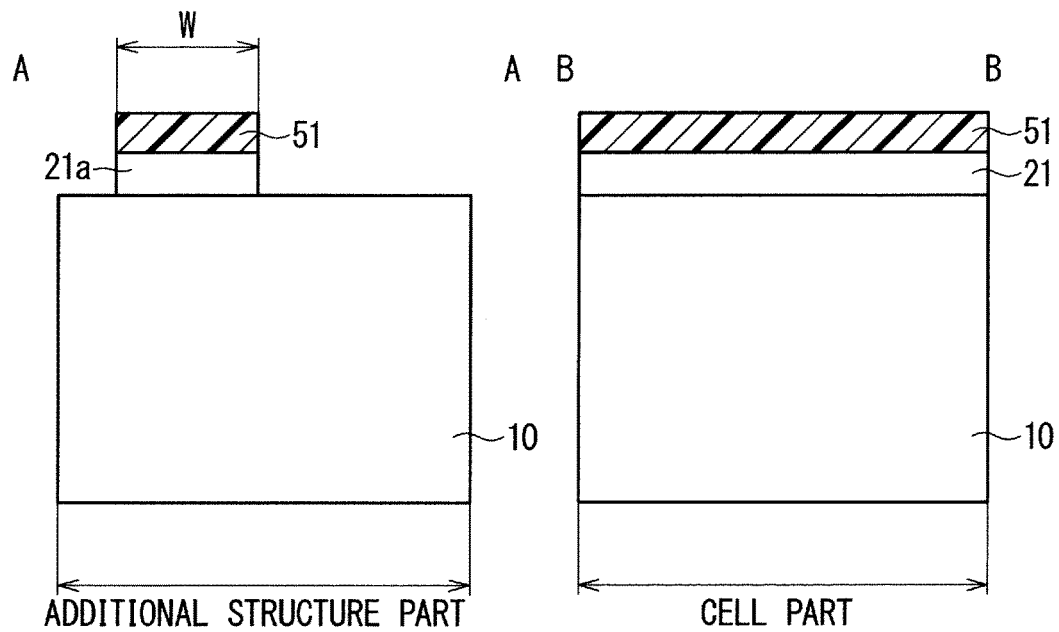
FIG. 31 is a partial cross-sectional view for describing a manufacturing process of the trench gate type IGBT in the modification example of the embodiment 1 according to the present invention.

FIG. 30 and FIG. 31 show a process of applying the resist member on the silicon oxide film 21, and performing the photomechanical process so that the resist member remains only in the region where the silicon oxide film 21a is formed in the additional structure part, thereby forming the resist mask 51. FIG. 30 and FIG. 31 correspond to the process described using FIG. 6 and FIG. 7.

As shown in FIG. 30 and FIG. 31, the width W of the resist mask 51 is larger than the width W of the resist mask 51 shown in FIG. 6 and FIG. 7, thus the silicon oxide film 21a having the large width W can be formed.

Embodiment 2

Figure 32:
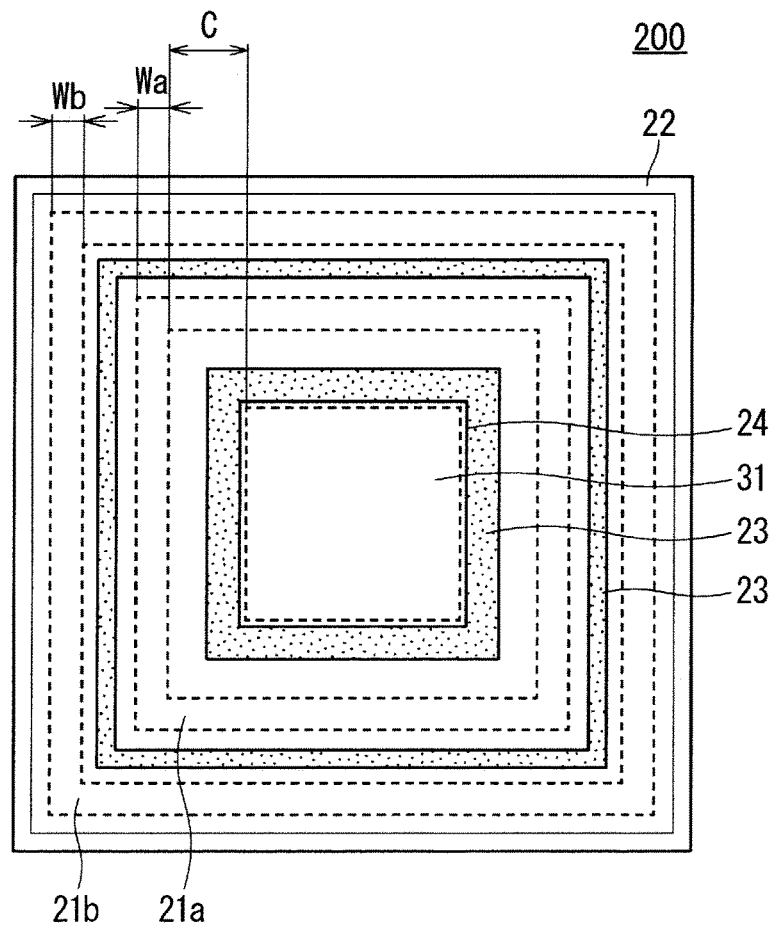
FIG. 32 is a plan view showing a configuration of a polysilicon added structure of a trench gate type IGBT in an embodiment 2 according to the present invention.
Figure 33:
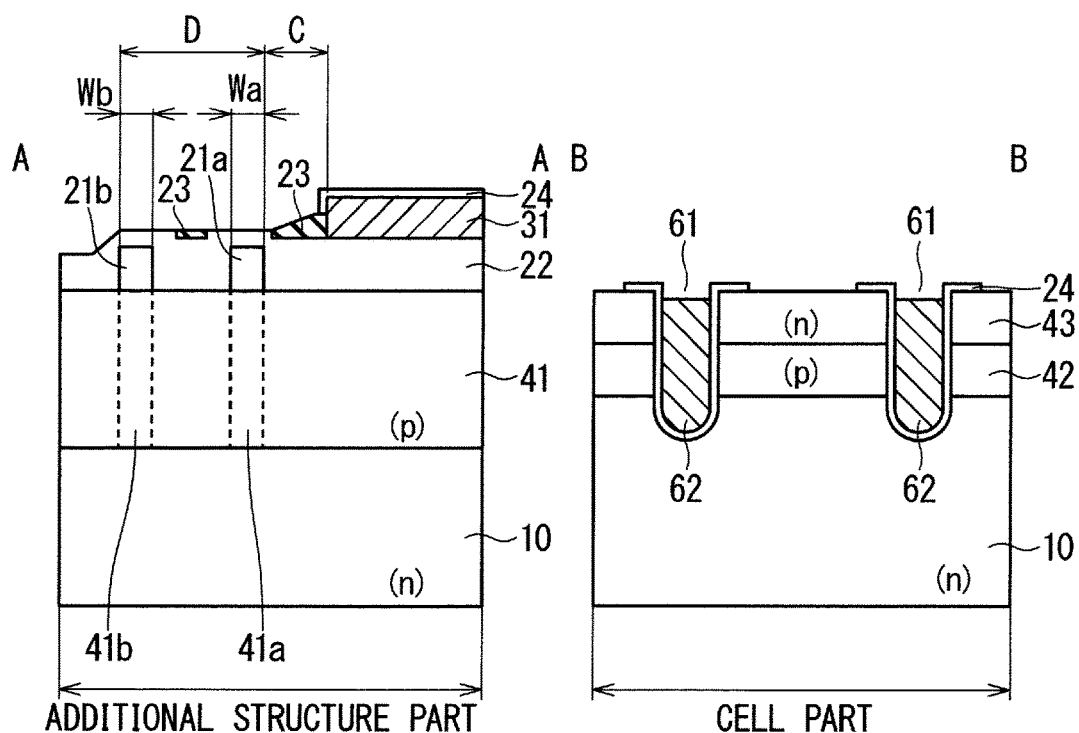
FIG. 33 is a partial cross-sectional view of the trench gate type IGBT in the embodiment 2 according to the present invention.

FIG. 32 and FIG. 33 are a plan view and a cross-sectional view showing a configuration of a characteristic part of a trench gate type IGBT 200 in an embodiment 2 according to the present invention, respectively, and correspond to the plan view and the cross-sectional view showing the configuration of the characteristic part of the trench gate type IGBT 100 shown in FIG. 2 and FIG. 3, respectively. The same reference numerals as those in FIG. 2 and FIG. 3 will be assigned to the same configuration, and a repetitive description is omitted.

The trench gate type IGBT 200 is different from the trench gate type IGBT 100 in the embodiment 1 in that the looped silicon oxide film 21a and a looped silicon oxide film 21b (a fourth silicon oxide film) doubly surround the polysilicon added structure 31.

That is to say, the embodiment 2 is the same as the embodiment 1 in that the looped silicon oxide film 21a with a width Wa is provided to surround the polysilicon added structure 31 in the position on the outer side of the end surface of the polysilicon added structure 31, being separated from the outer side thereof by the distance C, but is different in that the looped silicon oxide film 21b with a width Wb is provided to surround the silicon oxide film 21a further outside the silicon oxide film 21a. The looped silicon oxide film 21b is also referred to as the other looped film in some cases hereinafter.

When the well diffusion layers 41a and 41b each having a lower concentration than the surrounding well diffusion layer 41 are formed immediately below the silicon oxide films 21a and 21b, respectively, each of the widths Wa and Wb is set to have a value smaller than 2.0 times as large as the distance of the lateral direction diffusion of the dopant or a value smaller than 1.2 times as large as the distance of the vertical direction diffusion of the dopant.

When the silicon oxide films 21a and 21b are provided in this manner, the silicon oxide film 23 remains on the end surface of the polysilicon added structure 31, and the silicon oxide film 23 also remains between the silicon oxide films 21a and 21b.

As described above, when the silicon oxide films 21a and 21b are provided, the same effect as the case of increasing the width W of the silicon oxide film 21a is obtained. That is to say, when the silicon oxide films 21a and 21b are provided, a length of the silicon oxide film 23 extending outward beyond the silicon oxide films 21a and 21b from the end surface of the polysilicon additional structure 31 increases by a sum of the distance C from the end surface of the polysilicon added structure 31 to the looped silicon oxide film 21a and a distance D from an inner end surface of the silicon oxide film 21a to an outer end surface of the silicon oxide film 21b. As a result, even when the etching such as the wet etching or the CDE with a large side etching is applied, it can be prevented that the silicon oxide film 23 is removed from the end surface of the polysilicon added structure 31.

Figure 34:
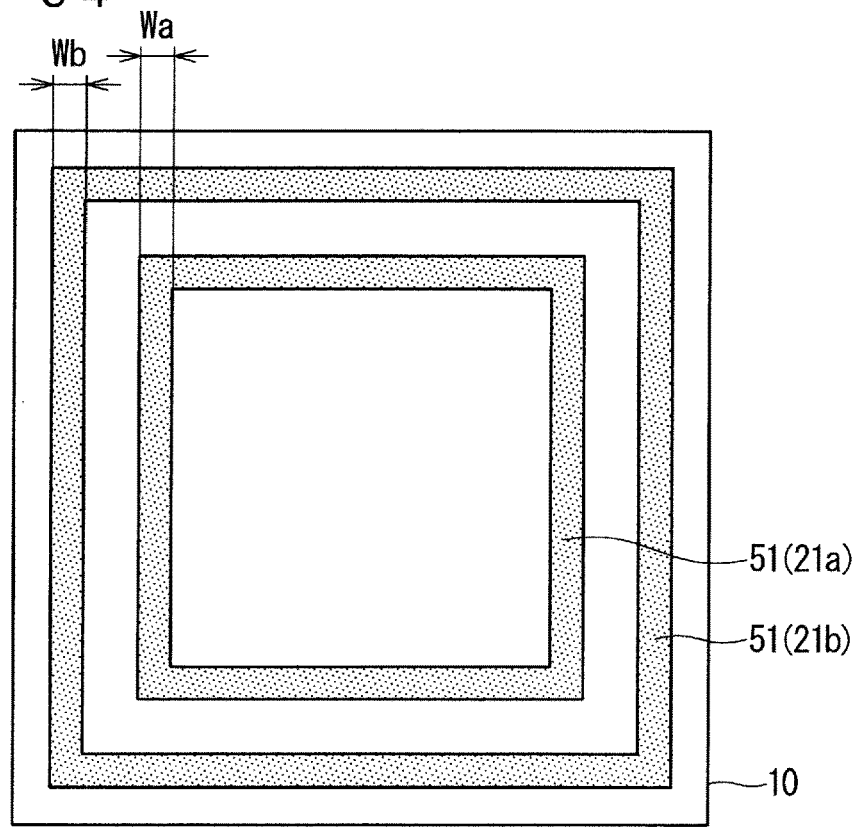
FIG. 34 is a plan view for describing a manufacturing process of the polysilicon added structure of the trench gate type IGBT in the embodiment 2 according to the present invention.
Figure 35:
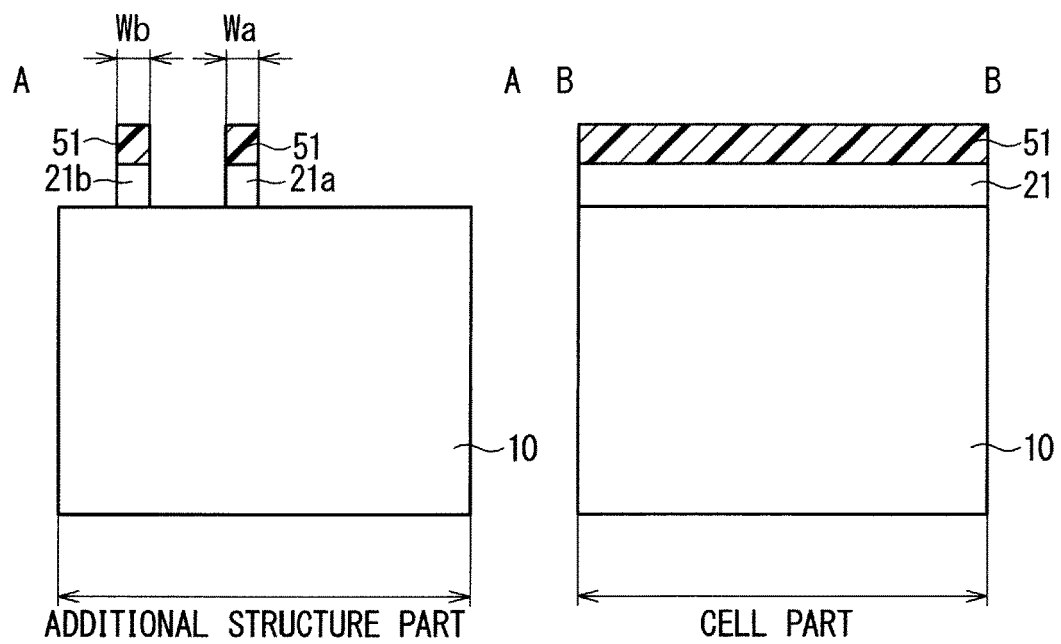
FIG. 35 is a partial cross-sectional view for describing a manufacturing process of the trench gate type IGBT in the embodiment 2 according to the present invention.

FIG. 34 and FIG. 35 show a process of applying the resist member on the silicon oxide film 21, and performing the photomechanical process so that the resist member remains only in the region where the silicon oxide films 21a and 21b are formed in the additional structure part, thereby forming the resist mask 51. FIG. 34 and FIG. 35 correspond to the process described using FIG. 6 and FIG. 7.

When the silicon oxide films 21a and 21b are provided, the widths thereof need not be increased, thus the region where the well diffusion layer 41 is not formed does not occur immediately below the silicon oxide films 21a and 21b as in the case of increasing the widths, and the well diffusion layer 41 is not divided. This configuration can be applied to a case where the division of the well diffusion layer 41 is not preferred.

In a case where there is no problem even if the well diffusion layer 41 is not formed immediately below the silicon oxide films 21a and 21b but the n type region is formed, so that the well diffusion layer 41 is divided, the width Wa of the silicon oxide film 21a and the width Wb of the silicon oxide film 21b may be set to a value equal to or larger than 2.0 times as large as the distance of the lateral direction diffusion of the dopant or a value equal to or larger than 1.2 times as large as the distance of the vertical direction diffusion of the dopant.

Described above is the example that the looped silicon oxide films 21a and 21b doubly surround the polysilicon added structure 31, however, the polysilicon added structure 31 may be surrounded triply or more. Also in this case, the polysilicon added structure 31 is disposed so that the end surface of the polysilicon added structure 31 is located in the position on the inner side of the end surface of the innermost looped silicon oxide film, being separated from the inner side thereof by the distance C.

<Modification Example>

Figure 36:
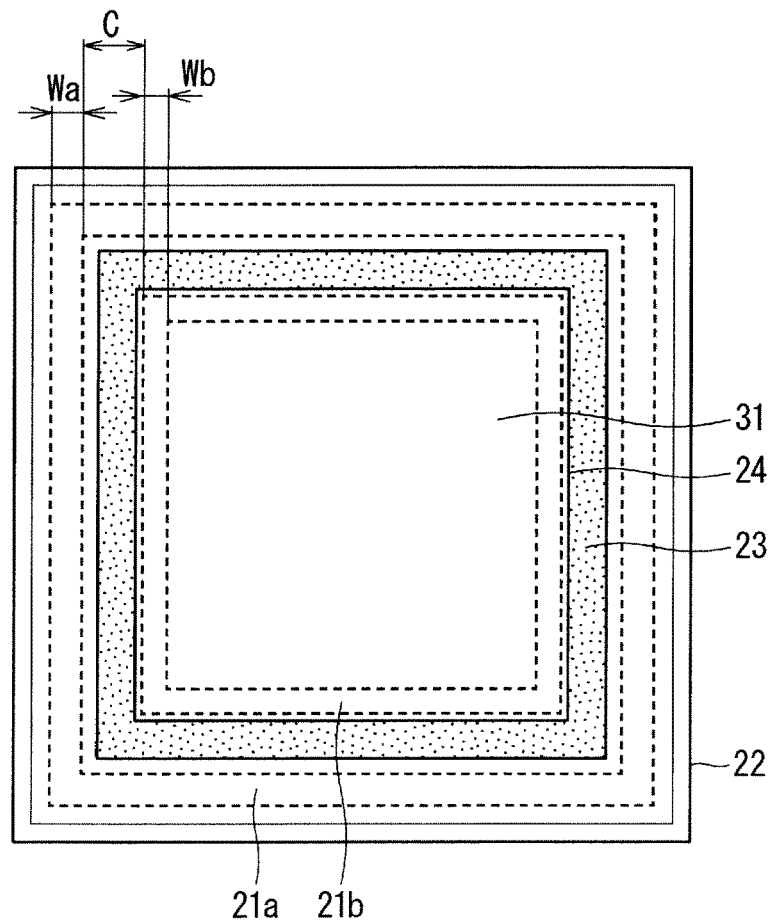
FIG. 36 is a plan view showing a configuration of a polysilicon added structure of the trench gate type IGBT in a modification example of the embodiment 2 according to the present invention.
Figure 37:
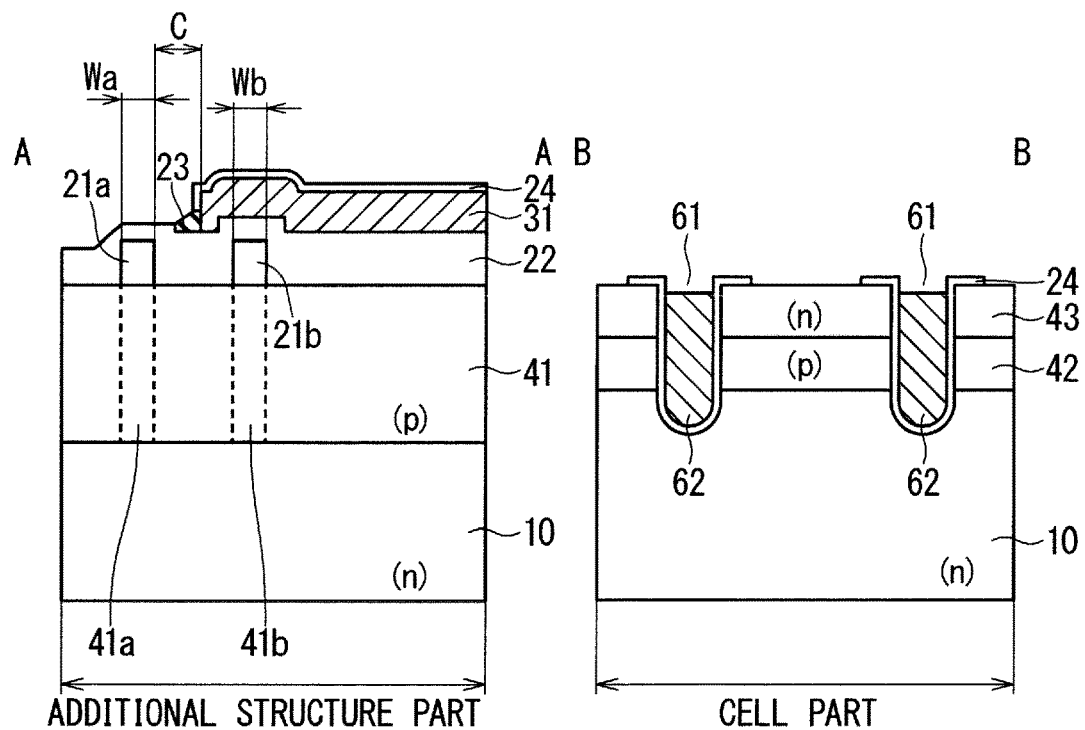
FIG. 37 is a partial cross-sectional view of the trench gate type IGBT in the modification example of the embodiment 2 according to the present invention.

In the trench gate type IGBT 200 according to the embodiment 2 described above, the polysilicon added structure 31 is disposed so that the end surface of the polysilicon added structure 31 is located in the position on the inner side of the end surface of the innermost silicon oxide film 21a, being separated from the inner side thereof by the distance C as described using FIG. 32 and FIG. 33, however, the polysilicon added structure 31 may be disposed so that the end surface of the polysilicon added structure 31 is located between the silicon oxide films 21a and 21b as shown in FIG. 36 and FIG. 37.

This configuration is the same as that in the embodiment 2 in that the looped silicon oxide film 21a with the width Wa is provided to surround the polysilicon added structure 31 in the position on the outer side of the end surface of the polysilicon added structure 31, being separated from the outer side thereof by the distance C, but is different in that the looped silicon oxide film 21b with the width Wb is provided to surround the polysilicon added structure 31 on the inner side of the silicon oxide film 21a.

Also in this case, the silicon oxide film 23 can remain on the end surface of the polysilicon added structure 31. In a case of adopting this configuration, the polysilicon added structure 31 is formed to get on the portion having the uneven surface, which is caused by the presence of the silicon oxide film 21b, thus an adhesion area of the polysilicon added structure 31 and the silicon oxide film 22 as the foundation layer increases, and the effect of suppressing a peel-off of the polysilicon added structure 31 from the silicon oxide film 22 is increased even if an impact and stress are applied from outside.

Described above is the example that the looped silicon oxide films 21a and 21b doubly surround the polysilicon added structure 31, however, the polysilicon added structure 31 may be surrounded triply or more. Also in this case, the polysilicon added structure 31 is disposed so that the end surface of the polysilicon added structure 31 is located between any of the plurality of looped silicon oxide films and the end surface of the polysilicon added structure 31 is separated from the end surface on the inner side of the looped silicon oxide film by the distance C.

<Another Example of Polysilicon Added Structure>

The trench gate type IGBTs 100 and 200 according to the embodiments 1 and 2 described above describe the example of providing the polysilicon added structure 31 serving as the diode for detecting the temperature in the center part of the active region AR, however, the diode for detecting the temperature may be provided on an end edge part of the active region AR.

Figure 38:
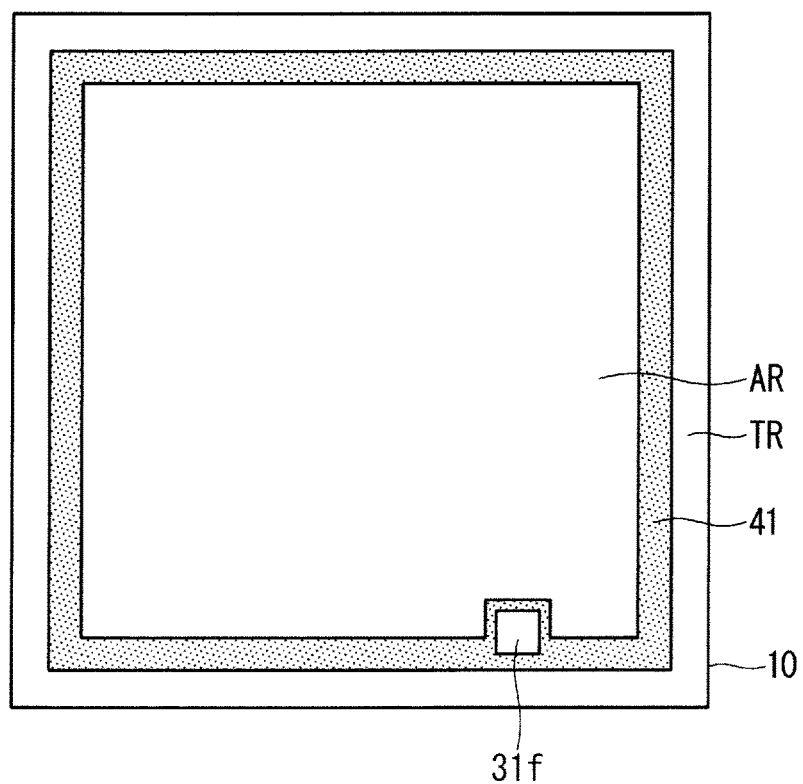
FIG. 38 is a plan view showing another example of the polysilicon added structure applied to the present invention.
Figure 39:
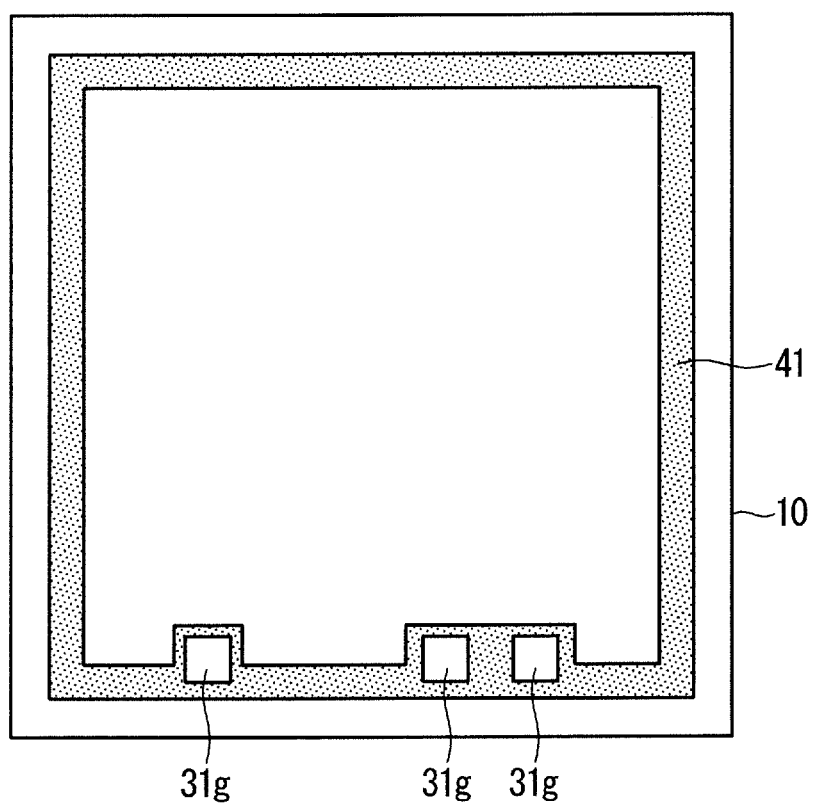
FIG. 39 is a plan view showing another example of the polysilicon added structure applied to the present invention.

FIG. 38 shows a configuration of providing a polysilicon added structure 31f serving as a diode for detecting the temperature on an upper side of a part of the well diffusion layer 41 surrounding the active region AR, and corresponds to FIG. 1.

It is also applicable to use the configuration of providing the polysilicon added structure 31 serving as the diode for detecting the temperature in the center part of the active region AR together as shown in FIG. 1.

The polysilicon added structure may be provided as an impact buffer structure at a time of pressure bonding a wire to an electrode pad on a surface of a device by wire bonding. The electrode pad is provided on the end edge part of the active region AR in many cases, thus, for example, a polysilicon added structure 31g as the impact buffer structure is provided on an upper side of the part of the well diffusion layer 41 surrounding the active region AR.

The silicon oxide film 23 is also provided to have contact with the end surface in each of the polysilicon added structures 31f and 31g in the manner similar to the polysilicon added structure 31, thus the residue of the conductive film does not occur on the end surface of each of the polysilicon added structures 31f and 31g.

The silicon oxide film 21a with the width W is provided in a position on an outer side of the end surface of each of the polysilicon added structures 31f and 31g, being separated from the outer side thereof by the distance C on the well diffusion layer 41 as shown in FIG. 3.

As well as a configuration described above, the polysilicon added structure is also applied to a case where the pn junction structure of the p type polysilicon film and the n type polysilicon film is provided on the well diffusion layer with the silicon oxide film therebetween so that an electrical insulation of the adjacent cell part is maintained by a junction breakdown voltage of the pn junction structure. The configuration of preventing the residue described above is also effective in forming such a pn junction structure.

According to the present invention, the above embodiments can be arbitrarily combined, or each embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
a semiconductor layer of a first conductivity type;
a diffusion layer of a second conductivity type provided on an upper layer portion of the semiconductor layer;
a polysilicon added structure formed of polysilicon to be provided on the diffusion layer with a first silicon oxide film therebetween;
a second silicon oxide film provided to have contact with an end surface of the polysilicon added structure, and having a gradual downward inclination from the end surface of the polysilicon added structure; and
a third silicon oxide film provided on the diffusion layer with a predetermined distance from the end surface of the polysilicon added structure, and covered by the first silicon oxide film, wherein
the first silicon oxide film is raised at a portion covering the third silicon oxide film, and constitutes a silicon oxide film with a smoothed step-like surface layer formed of the portion raised and the second silicon oxide film having the gradual downward inclination.

2. The semiconductor device according to claim 1, wherein
the diffusion layer includes at least a low concentration diffusion layer having a lower impurity concentration than an impurity concentration of a surrounding area in a portion immediately below the third silicon oxide film.

3. The semiconductor device according to claim 2, wherein
the diffusion layer includes a first and second low concentration diffusion layers each having a lower impurity concentration than an impurity concentration of a surrounding area in a portion immediately below an end edge part on a side of the poly silicon added structure in the third silicon oxide film and a portion immediately below an end edge part on an opposite side of the polysilicon added structure, and includes the semiconductor layer between the first and second low concentration diffusion layers.

4. The semiconductor device according to claim 1, comprising
a fourth silicon oxide film provided on the diffusion layer with a predetermined distance from the third silicon oxide film on an opposite side of the polysilicon added structure, wherein
the first silicon oxide film is raised in a portion covering the third and fourth silicon oxide films.

5. The semiconductor device according to claim 1, comprising
a fourth silicon oxide film provided on the diffusion layer with a predetermined distance from the third silicon oxide film on a side of the polysilicon added structure, wherein
the first silicon oxide film is raised in a portion covering the third and fourth silicon oxide films, and
the polysilicon added structure is formed to get on a portion where the first silicon oxide film covers the fourth silicon oxide film.

6. A method of manufacturing a semiconductor device, comprising steps of:
(a) forming a third silicon oxide film on a semiconductor layer of a first conductivity type;
(b) patterning the third silicon oxide film to form a looped film having a first width;
(c) after the step (b), ion implanting an impurity of a second conductivity type from an upper side of the looped film to form a diffusion layer of a second conductivity type on an upper layer portion of the semiconductor layer;
(d) after the step (c), forming a first silicon oxide film on the semiconductor layer to cover the looped film;
(e) forming a first polysilicon film on the first silicon oxide film;
(f) patterning the polysilicon film to form a polysilicon added structure;
(g) forming a second silicon oxide film on the semiconductor layer to cover the polysilicon added structure;
(h) after the step (g), removing the second silicon oxide film and leaving the second silicon oxide film only on an end surface of the polysilicon added structure to have a gradual downward inclination from the end surface;
(i) forming an insulating film and a second polysilicon film in layers to cover the first and second silicon oxide films and the polysilicon added structure; and
(j) partially removing the second polysilicon film, wherein
the step (f) includes a step of forming the polysilicon added structure so that an end surface on an inner side of the looped film is separated from the end portion of the polysilicon added structure by a predetermined distance.

7. The method of manufacturing the semiconductor device according to claim 6, wherein
the step (b) includes a step of setting the first width of the looped film to a value smaller than 2.0 times as large as a distance of a lateral direction diffusion of a dopant of the diffusion layer or a value smaller than 1.2 times as large as a distance of a vertical direction diffusion of the dopant.

8. The method of manufacturing the semiconductor device according to claim 6, wherein
the step (b) includes a step of setting the first width of the looped film to a value equal to or larger than 2.0 times as large as a distance of a lateral direction diffusion of a dopant of the diffusion layer or a value equal to or larger than 1.2 times as large as a distance of a vertical direction diffusion of the dopant.

9. The method of manufacturing the semiconductor device according to claim 6, wherein
the predetermined distance is set to a value smaller than twice as large as a film thickness of the second silicon oxide film.

10. The method of manufacturing the semiconductor device according to claim 6, wherein
the step (b) includes a step of patterning at least one looped film other than the looped film on an outer side of the looped film, and
the step (d) includes a step of forming the first silicon oxide film to cover the looped film and the at least one looped film other than the looped film.

11. The method of manufacturing the semiconductor device according to claim 6, wherein
the step (b) includes a step of patterning at least one looped film other than the looped film on an inner side of the looped film,
the step (d) includes a step of forming the first silicon oxide film to cover the looped film and the at least one looped film other than the looped film, and
the step (f) includes a step of forming the polysilicon added structure to get on a portion where the first silicon oxide film covers the at least one looped film other than the looped film.

\* \* \* \* \*